(12) United States Patent
Tiffany, III

(10) Patent No.: US 6,241,153 B1
(45) Date of Patent: Jun. 5, 2001

(54) METHOD FOR MAKING TAMPER-PREVENTING, CONTACT-TYPE, SMART CARDS

(75) Inventor: Harry J. Tiffany, III, Weldona, CO (US)

(73) Assignee: CardXX, Inc., Windsor, CO (US)

( * ) Notice: Subject to any disclaimer, the term of this patent is extended or adjusted under 35 U.S.C. 154(b) by 0 days.

(21) Appl. No.: 09/268,169

(22) Filed: Mar. 12, 1999

Related U.S. Application Data

(60) Provisional application No. 60/078,255, filed on Mar. 17, 1998.

(51) Int. Cl.[7] .................................................. G06K 19/02
(52) U.S. Cl. ........................... 235/488; 235/492; 361/737
(58) Field of Search .................... 235/488, 487, 235/492; 361/737, 761

(56) References Cited

U.S. PATENT DOCUMENTS

| | | |
|---|---|---|
| 4,539,472 | 9/1985 | Poetker et al. . |
| 4,792,843 | 12/1988 | Haghiri-Tehrani et al. . |
| 4,931,853 | 6/1990 | Ohuchi et al. . |
| 5,027,190 | 6/1991 | Haghiri-Tehrani et al. . |
| 5,067,008 | 11/1991 | Yanaka et al. . |
| 5,134,773 | 8/1992 | LeMaire et al. . |
| 5,164,144 | 11/1992 | Rose . |
| 5,272,374 | 12/1993 | Kodai et al. . |
| 5,311,396 | 5/1994 | Steffen . |
| 5,350,553 | 9/1994 | Glaser et al. . |
| 5,387,306 | 2/1995 | Jarvis . |
| 5,399,907 | 3/1995 | Nguyen et al. . |
| 5,416,358 | 5/1995 | Ochi et al. . |
| 5,468,910 | 11/1995 | Knapp et al. . |
| 5,486,687 | 1/1996 | Le Roux . |
| 5,510,074 | 4/1996 | Rose . |
| 5,598,032 | * 1/1997 | Fidalgo ................................ 235/492 |
| 5,822,190 | 10/1998 | Iwasaki . |
| 5,894,006 | 4/1999 | Herbst . |
| 5,898,215 | 4/1999 | Miller et al. . |
| 6,031,724 | * 2/2000 | Takahashi .......................... 235/492 |
| 6,049,463 | * 4/2000 | O'Malley et al. ................... 361/737 |

\* cited by examiner

Primary Examiner—Karl D. Frech
Assistant Examiner—Daniel St.Cyr
(74) Attorney, Agent, or Firm—Dorr, Carson, Sloan & Birney, P.C.

(57) ABSTRACT

Smart cards having high quality external surfaces can be made through use of a primer/adhesive (and, optionally, anchor hooks) on the lower surface of an electrical component in order to affix said electrical component to a thermosetting material that becomes the core layer of said cards.

76 Claims, 15 Drawing Sheets

AFTER COLD, LOW PRESSURE FORMING

BEFORE COLD, LOW PRESSURE FORMING

AFTER COLD, LOW PRESSURE FORMING

BEFORE COLD, LOW PRESSURE FORMING

AFTER COLD, LOW PRESSURE FORMING

METHOD FOR MAKING TAMPER-PREVENTING, CONTACT-TYPE, SMART CARDS

RELATED PATENT APPLICATION

This patent application claims the benefit of, including the filing date of, Provisional Application No. 60/078,255 entitled "Provisional Patent Application re: Method for Making Tamper-Preventing, Contact-Type, Smart Cards", filed Mar. 17, 1998.

BACKGROUND OF THE INVENTION

Smart cards are used as bankcards, ID cards, telephone cards and the like. They are based upon the use of an electromagnetic coupling (either by direct physical contact or by electromagnetic waves) between a smart card's electronic components and a card reader, pickup head or other appropriate electronic signal receiving device such as those employed in an ATM. Because these cards are so widely used to effect very valuable and/or otherwise important transactions, they are the frequent subject of fraudulent activities. These fraudulent activities often involve physically tampering with a smart card's electronic components. For example, their computer chips or other electronic components are removed from a valid smart card and physically transferred to a fraudulent card in order to gain money, unauthorized access, unauthorized information, etc.

Smart cards are usually made by assembling several layers of plastic sheets in a sandwich array. In the case of so-called "contact" type smart cards at least one face of the smart card has an opening in which an electronic signal sensing component such as a strip-like sensor, computer chip, module or "pickup head" reside(s). The electronic signal sensing component comes into direct physical contact with an electrically cooperating component of a machine (e.g., an ATM machine, credit card transaction machine, a personal identity verification machine, telephone, etc.) in which the contact type smart card is employed. Many contact type smart cards have all of their electrical components (e.g., their electronic signal sensing device and their computer chip assembled) in a unified module that is glued in an open cavity in a face of the card. By way of distinction, so-called "contactless" smart cards communicate with the machines in which they are employed by means of a radio wave-receiving antenna that is embedded in the interior of the contactless smart card. Hence, there is no physical contact between the card's electronic signal sensing component(s) and the user machine's signal sensing component. Some smart cards operate in hybrid, contact/contactless, modes of operation.

Applicant's invention may be used with any of these three types of smart card; but for reasons hereinafter more fully explained, it is more particularly concerned with "contact" type smart cards and/or the methods employed to manufacture them. The methods by which prior art smart cards have been manufactured have varied considerably. For example, U.S. Pat. No. 5,272,374 discloses an integrated chip-employing smart card comprising a card board having a first and a second major surface and a semiconductor module having an electrode terminal face. The semiconductor module is mounted in the card board such that the electrode terminal face is left exposed in the first major surface of the card board.

U.S. Pat. No. 5,311,396 teaches a portable and connectable chip-based smart card system having one or more chips integrated into a package. The electronic component is mounted on the upper surface of metal contacts. A lower surface has metal contacts that constitute a connector of the system. Each of the metal contacts of the upper face is connected to, and faces, a metal contact of the lower surface, and vice versa. In a second embodiment of this invention, the electronic component is surface mounted on an upper surface of the metal contacts in a manner such that the lower surface of these contacts forms the connector.

U.S. Pat. No. 5,486,687 teaches a memory card having several integrated circuits for personal computers. These memory cards serve as a large capacity mass memory for replacing floppy disks and other exchangeable magnetic supports. They are provided with a plug-in connector at the end of the card and can be inserted in the reader in a prescribed manner, e.g., in accordance with PCMCIA standards. According to one aspect of this invention, a flush contact chip card memory is formed by such a plug-in card. To this end, the card has a supplementary connector with flush contacts on its principal face. The resulting reader is transportable. Its application software can be stored in the card and can be installed in any random microcomputer equipped with a PCMCIA reader.

All of these prior art methods for making contact smart cards are to some degree concerned with properly positioning and fixing the electronic signal sensing component module or assembly inside the smart card in such a way that they present a flat surface on or substantially flush with the card's face surface (or its obverse surface). Unfortunately, this proximity of the signal sensing component to the face surface (or its obverse) of contact smart cards presents an opportunity for tampering with, and fraudulent use of, such cards.

SUMMARY OF THE INVENTION

Applicant's smart cards (e.g., credit cards, ATM cards, personal identity cards, access control cards, telephone cards, etc.) and methods for making them are primarily based upon the use of certain hereinafter more fully described physical elements and manufacturing procedures. Applicant's tamper-preventing construction for contact type smart cards is achieved by coating the rear side of the smart card's contact device (e.g., its signal sensor, pickup head, computer chip) with a primer/adhesive that has the ability to form a strong bond with a thermosetting polymeric material that is injected into a void space that eventually becomes the core or center layer of the smart card. This construction method is based upon applicant's finding that the bonding action between a primer/adhesive and the thermosetting polymeric material that forms the core of the card is much stronger than the bonding action between the rear surface of an electrical signal sensing component and a thermosetting polymeric material.

The tamper-preventing action provided by applicant's placement of a primer/adhesive on the rear side (i.e., the thermosetting polymer contacting-side) of the card's contact device can be replaced by or further enhanced by placement of certain, hereinafter more fully described, "anchor hooks" on the electrical sensing component in a manner such that said hooks are immersed in the incoming, liquid, thermosetting polymer. Thereafter, these "anchor hooks" become very strongly embedded in the thermosetting polymeric material when it cures. Indeed, the use of such anchor hooks can, in its own right, achieve the tamper preventing action provided by applicant's primer/adhesive-thermosetting material bond. In some of the more preferred embodiments of this invention the primer/adhesive and the anchor hooks will be used together to achieve the tamper-preventing action.

The primer/adhesives used in the hereindescribed processes are so-called solvent based, primer/adhesives. They usually employ methyl ethyl ketone as a solvent for an adhesive, polymeric material. 3M Adhesive Systems Industrial Tape and Specialties Division, 3M Center, Building 220-7E-01, St. Paul, Minn. makes several such primer/adhesives. Their 4475® Primer/adhesive is, however, particularly preferred for the practice of this invention. In actual manufacturing practice, these solvent based, primer/adhesives may be at least partially cured by exposure to an "artificial" energy source (i.e., an energy source other than ambient heat and/or light of the manufacturing plant). This exposure speeds up the curing process. These artificial energy sources may be further characterized by their ability to produce electromagnetic waves of a given wave length. Some primer/adhesives, for example, can be more quickly cured by exposure to energy sources giving off electromagnetic waves having wave lengths ranging from about 200 to about 400 nanometers (nm). Such primer/adhesives are sometimes referred to as being "UV curable". Electrically powered UV and/or microwave producing devices known to those skilled in this art may be employed as sources of such 200–400 nm wave forms. Use of devices that emit 260–270 nm wave forms is even more preferred when using certain UV curable primer/adhesives. Regardless of the type of solvent based, primer/adhesive being used, however, applicant's primer/adhesive "curing" step will most preferably, at least partially, take place in a period of time ranging from about 0.1 to about 10 seconds. Partial curing times of less than 3 seconds are even more preferred in high speed manufacturing processes.

These primer/adhesives should, most preferably, be employed in the form of at least one small layer, coating, mound, dollop, or hemisphere that is placed on an inside surface of the card's electronic signal sensing device that is exposed on an outside surface of a "contact" type card. In the case where the electronic signal sensing device is part of a module (e.g., one comprised of a signal sensor, a board, a chip, a potting device, etc.) the primer/adhesive is preferably placed on the bottommost element so that the primer/adhesive will come into intimate contact with the thermosetting material which, upon curing, become the center or core layer of the card. Such layer, mound, etc. of the primer/adhesive is preferably applied to the electronic signal sensing component, or the undermost component (e.g., the computer chip or porting device) of the module before being placed in an opening or holding hollow in the smart card's top (or bottom) layer. Again, this exposure of the signal sensing device allows it to come into physical contact with a signal reading device in a card-reading machine such as an ATM.

The beneficial effects of applicant's manufacturing procedures can be further enhanced by use of (1) certain hereinafter more fully described "cold," "low pressure," forming procedures, (2) certain physical placements of other electronic components (e.g., chips other than those in the module) within these smart cards, (3) certain thermoset flow gate geometries and (4) certain receptacles in applicant's molds for receiving thermoset material that may be injected in excess of the amount needed to form the core regions of applicant's smart cards. Aside from their tamper-preventing features, the smart cards made using the hereindescribed elements and manufacturing methods also are characterized by their high quality external surfaces. The term "high quality" in the context of this patent disclosure should be taken to imply substantially flat external surfaces (i.e., card faces having no waves, bends, wrinkles or pock marks).

Applicant's contact type, smart cards are generally comprised of a top layer having an inside surface and an outside surface, a bottom layer having an inside surface and an outside surface and a center or core layer that is sandwiched between the top and bottom layers. Either the top layer or the bottom layer (or both layers) of a contact type smart card made according to the methods of this patent disclosure may have an opening in which an electrical signal sensing device is affixed. Such devices are usually associated with other electronic components such as computer chips, boards, pods, etc. Hence, the resulting devices are frequently referred to as "modules." One of the most common devices of this kind is a contact which (via a board) is combined with a chip to form a signal sensing/processing module.

In other cases, however, some of the additional electronic components (e.g., computer chips, capacitors, etc.) of applicant's contact type smart cards may be completely embedded in the thermosetting polymeric material that constitutes the card's center or core layer. Hence, these completely embedded electronic components form no part of the external surface of applicant's finished smart cards. Such cards are sometimes referred as hybrid or "combi" smart cards. Again, in the case of contact type cards, the card's electrical signal sensor device (its pickup head, contact surface, etc.) are placed in contact with a reading machine through an opening in a face (top or bottom) of the contact type smart card. Thus, electrical signal-carrying contact by the reading machine using the contact card (e.g., with an ATM) is made with the card via this exposed electrical contact in the face side (or obverse side) of the card.

In all cases, however, all three of these layers are unified into a smart card body by a bonding action between the thermosetting polymeric material used to create the core layer of such cards and those material(s) such as PVC, out of which the top and bottom layers are made. In some of the more preferred embodiments of applicant's invention, this bonding action may be augmented through use of various hereinafter more fully described treatments of the inside surfaces of the top and/or of the bottom layer of applicant's smart cards.

Before delving any further into the more specific details of applicant's methods for making the hereindescribed tamper-preventing smart cards, it should be noted that, for the purposes of this patent disclosure, the terms "upper" and "lower," or "top" and "bottom," layer(s) should be regarded as being relative. That is to say that they are implied by the relative positions of the mold shells that are employed to manufacture these cards. Hence, these terms should not imply any absolute position or orientation of the card itself.

Be this top/bottom nomenclature as it may, the hereindescribed methods for making tamper-preventing smart cards in general, and tamper-preventing contact type smart cards in particular, will employ reaction injection molding machines (which are often individually referred to as "RIM"). These machines are associated with a top mold shell and a bottom mold shell that, most preferably, are capable of performing certain hereinafter more fully described cold, low pressure, forming operations on at least one of the sheets of polymeric material (e.g., PVC) that make up the two major external surface layers of applicant's smart cards. Such top and bottom mold shells cooperate in ways that are well known to those skilled in the polymeric material molding arts. For use in applicant's particular processes, however, at least one of the RIM's mold shells, e.g., the top mold shell, will have at least one cavity for partially defining the thickness of, and general peripheral extent of, a precursor smart card body that is to be formed, and most preferably cold, low pressure formed, between the two mold shells.

It might also be noted here that applicant's use of the term "precursor smart card body" (which will include bodies of "excess" polymeric material) is to distinguish those roughly defined card bodies that are formed by such mold devices from those "finished" smart cards that are produced by removing the excess polymeric materials (e.g., by trimming them off of the precursor card body) and by cutting the precursor card bodies to certain prescribed sizes. For wide commercial use, all smart cards also must be made to very precise, standardized dimensions. For example, ISO Standard 7810 requires that contactless smart cards have a nominal length of 85.6 mm, a nominal width of 53.98 mm and a nominal thickness of 0.76 mm. Such cutting to prescribed sizes also may remove the excess material in one cutting/trimming operation. It also will be well appreciated by those skilled in this art that the molding devices used to make such cards in commercial production operations will most preferably have mold shells having multiple cavities (e.g., 2, 4, 6, 8, etc.) for making several such cards simultaneously.

Those skilled in this art also will appreciate that applicant's use of terms like "polymeric," "plastic," "thermoplastic" and "thermosetting" each refer to a potentially wide variety of polymeric materials. Be that as it may, the polymeric materials employed by applicant will generally fall into one of two subcategories—thermoplastic materials, or thermosetting materials. Thermoplastic materials are characterized by their possession of long molecules (either linear or branched) that have side chains or groups that are not attached to other polymer molecules. Consequently, thermoplastic materials can be repeatedly softened and hardened by heating and cooling so they can be formed, and then cooled to form a final hardened shape. Generally speaking, no appreciable chemical changes take place during such heat driven, forming operations. Conversely, thermosetting materials (such as their resins), have chemically reactive portions that form chemical cross-linkages between their long molecules during their polymerization. In other words, these linear polymer chains become bonded together to form stereo chemical structures. Therefore, once such thermosetting resins are hardened, the resulting material cannot be softened by heating without degrading at least some of the chemical cross linking molecular groups.

Either form of polymeric material (thermoplastic or thermosetting) may be used for the top layer and/or the bottom layer of applicant's smart cards. Hence, applicant's use of the general term "polymeric" with respect to the materials out of which applicant's top and bottom layers can be made should be taken to include thermosetting materials as well as thermoplastic materials. Thermosetting polymers are, however, highly preferred for creating the center or core layer of applicant's smart cards. There are several reasons for this preference. For example, thermosetting polymers generally bond better with the materials (e.g., PVC) from which the top and bottom layers are preferably made. Thermosetting polymers also can be commercially obtained in relatively inexpensive, easy to use, liquid monomer-polymer mixtures, or partially polymerized molding compounds, that are particularly well suited for use in applicant's high speed, cold, low pressure forming operations.

Some representative polymeric materials (thermoplastic or thermosetting) that can be used for making applicant's top and bottom layers will include polyvinyl chloride, polyvinyl dichloride, polyvinyl acetate, polyethylene, polyethylene-terephthalate, polyurethane, acrylonitrile butadiene styrene, vinyl acetate copolymer, polyesters, polyethylene, epoxy and silicones. Such top and bottom layers also may be made from other polymeric materials such as polycarbonate, cellulose acetate and cellulose acetate butyrate-containing materials. Of all the polymeric materials from which applicant's top and bottom layers could be made, however, polyvinyl chloride ("PVC") is especially preferred because of the clear to opaque visual qualities of this material and its ability to receive printing and its relatively lower cost.

The most preferred thermosetting materials for applicant's injection purposes are polyurethane, epoxy and unsaturated polyester polymeric materials. By way of some more specific examples, polyurethanes made by condensation reactions of isocyanate and a polyol derived from propylene oxide or trichlorobutylene oxide are especially preferred. Of the various polyesters that can be used in applicant's processes, those that can be further characterized as being "ethylenic unsaturated" are particularly preferred because of their ability to be cross linked through their double bonds with compatible monomers (also containing ethylene unsaturation) and with the materials out of which applicant's top and bottom layers are made. The more preferred epoxy materials for use in the practice of this invention will be those made from epichlorohydrin and bisphenol A, or epichlorohydrin, and an aliphatic polyol (such as glycerol). They are particularly preferred because of their ability to bond with some of the more preferred materials (e.g., PVC) out of which applicant's top and bottom layers are made. These three general kinds of thermosetting material, (polyurethane, epoxy and unsaturated polyester), also are preferred because they do not tend to chemically react with applicant's more preferred glues (e.g., various cyanoacrylate-based glues), to form unsightly "artifacts" in the core regions of applicant's card bodies.

Next, it should be noted that applicant's use of expressions such as "cold, low pressure forming conditions" generally should be taken to mean forming conditions wherein the temperature of the injected polymeric liquid or semi-liquid material is less than the heat distortion temperature of the plastic sheet material being cold formed (e.g., the top layer of applicant's smart cards), and pressures less than about 500 psi. In some of the more preferred embodiments of the hereindescribed processes, the cold forming temperatures used in applicant's processes will be at least 100° F. less than the heat distortion temperature of the plastic sheet material being molded. By way of a more specific example, the heat distortion temperature of many polyvinyl chloride materials is about 230° F. Hence, the temperatures used to cold form such PVC sheets in applicant's process preferably will be no more than about (230° F.–100° F.). Temperatures of about 130° F. are particularly preferred for such materials.

Applicant's more preferred cold, low pressure forming procedures will involve injection of thermosetting polymeric materials whose temperatures range from about 56° F. to about 160° F., under pressures that preferably range from about atmospheric pressure to about 500 psi. More preferably, the temperatures of the thermosetting polymers being injected into the center or core region of applicant's cards will be between about 65° F. and about 130° F. under injection pressures that preferably range from about 80 to 120 psi. In some of the most preferred embodiments of this invention the liquid or semi-liquid thermosetting polymeric material will be injected into any given card forming cavity under these preferred temperature and pressure conditions at flow rates ranging from about 0.1 to about 50 grams/second/card-forming cavity. Flow rates of 1.5 to 1.7 grams/seconds/ card-forming cavity are even more preferred. Those skilled in this art also will appreciate the applicant's low temperature and pressure conditions contrast rather sharply with the much higher temperatures (e.g., 200° F. to 1000° F.) and pressures (e.g., from 500 to 20,000 psi) that are often used in many prior art, high speed, smart card injection molding manufacturing operations.

It also should be noted that applicant's use of such relatively cold, low pressure, forming conditions may require that any given gate (i.e., the passageway that connects a runner with each individual card-forming cavity) be larger than those gates used in prior art, hot, high pressure operations. Applicant's gates are preferably relatively larger than prior art gates so that they are able to quickly pass the thermoset material being injected under applicant's cold, low pressure forming conditions wherein such thermoset materials are more viscous. Similarly, the runner (i.e., the main thermoset material supply passageway in the mold system that feeds from the source of the thermoset material to each individual gate), will normally be in a multi-gate or manifold array, and, hence, should be capable of simultaneously supplying the number of gates/card forming cavities (e.g., 4 to 8 cavities) in the manifold system at the relatively cold temperature (e.g., 56° F. to 160° F.) and relatively low pressure (e.g., atmospheric pressure to 500 psi) conditions used in applicant's process.

It also might be noted at this point that the flow rates for the polymeric thermoset material under applicant's low temperature and pressure conditions nonetheless, should be such that they are able to completely fill a given card-forming cavity in less than or about 10 seconds per card-forming cavity (and more preferably in less than about 3 seconds). Card-forming cavity fill times of less than 1 second are even more preferred where they can be achieved. In view of these cold-forming conditions, certain preferred embodiments of applicant's smart card making processes will employ gates having a width which is a major fraction of the length of a leading edge of the card to be formed (that is, a card edge which is connected to a gate). Applicant prefers that the width of a given gate be from about 20 percent to about 200 percent of the width of the leading edge (or edges—multiple gates can be used to fill the same card-forming cavity), i.e., the "gated" edge(s), of the smart card being formed.

Applicant also prefers to employ gates that are tapered down from a relatively wide inflow area to a relatively narrow core region that ends at or near the leading edge(s) of the card body being formed. Most preferably, these gates will narrow down from a relatively wide diametered (e.g., from about 5 to about 10 mm) injection port that is in fluid connection with a thermosetting material-supplying runner, to a relatively thin diameter (e.g., 0.10 mm) gate/card edge where the gate feeds the thermosetting material into the void space which ultimately becomes the center or core of applicant's finished card. By way of further example, applicant has found that gates that taper from an initial diameter of about 7.0 millimeters down to a minimum diameter of about 0.13 mm will produce especially good results under applicant's preferred cold, low pressure injection conditions.

Another optional feature that can be used to advantage along with applicant's glues and gluing procedures is the use of mold shells that have one or more receptacles for receiving "excess" polymeric material that may be purposely injected into the void space between applicant's top and bottom layers in order to expunge any air and/or other gases (e.g., those gases formed by the exothermic chemical reactions that occur when the ingredients used to formulate most polymeric thermoset materials are mixed together) from said void space. These thermoset ingredients are preferably mixed just prior to (e.g., about 30 seconds before) their injection into the void space.

Still other optional procedures that may be used to enhance the results of using applicant's manufacturing methods may include the use of: (1) treatments that encourage and/or augment the bonding action between the inside surfaces of the top and bottom layers and the injected thermosetting material, (2) films that display alphanumeric/graphic information that is visible at the card's major surface(s), (3) opacity promoting (or preventing) films or layers, (4) use of top layers or bottom layers that are at least partially pre-molded by a preceding molding operation (e.g., a preceding, prior art type, "hot" molding operation or a preceding "cold" molding operation such as those described in this patent disclosure and (5) the use of opacity promoting pigment(s) in the thermoset material. It might also be noted here that the outside surfaces of the smart cards resulting from applicant's manufacturing processes may be thereafter embossed or printed upon in order to display alphanumeric/graphic information.

Applicant's methods for making the smart cards of this patent disclosure also may, as an optional feature, involve the use of at least one gas venting procedure and/or at least one excess polymeric material receiving receptacle. More preferably, there will be at least one such receptacle per card-forming cavity. The presence of such gas venting and/or excess material receiving receptacles will allow gases (e.g., air, and the gaseous reaction products associated with those usually exothermic chemical reactions of the polymeric material forming ingredients) and/or relatively small amounts of the incoming thermoset polymeric material itself to escape from each void space during applicant's forming operations, e.g., cold, low pressure forming operations, and be received in such receptacles and/or be totally flushed out of the mold system. These gas venting procedures and excess material receptacles generally serve to prevent imperfections that may otherwise be created by entrapping gases in the void space during the injection of the polymeric material.

Thus, this aspect of applicant's invention involves injecting a flowable liquid or semi-liquid moldable polymeric material into a void space between the top and bottom layers of applicant's smart card in a process wherein the top and bottom molds are respectively abutted against the top and bottom layers of the smart card at a mold parting line perimeter or lip region at pressures that are sufficient to (a) completely fill the void space with a liquid or semi-liquid thermosetting polymeric material under the conditions (e.g., cold forming conditions) used in the hereindescribed processes, (b) immerse the primer/adhesive on the underside of the electrical signal sensor, module, etc., (c) immerse any anchor hooks associated with the electrical signal sensor or module, (d) drive minor amounts of the polymeric material out of the card forming cavities and into the excess material receptacle and/or (e) drive the gases in the void space to the excess material receptacle and/or drive such gases completely out of the mold system (e.g., drive such gases out of the mold at the parting line regions where the top and bottom mold shells come together). Thus, the mold lip pressures used in applicant's procedures should be sufficient to hold the pressures at which the thermoplastic material is injected in order to completely fill the void space between the top and bottom (e.g., between about ambient pressure and 200 psi), but still permit small amounts of the thermoset material and any gases to be flushed or squirted out of the mold system at its parting line. In other words, in these preferred embodiments, applicant's "excess" material receptacles need not, and preferably will not, receive all of the excess material injected into the void space. Excess thermoset material and/or gases also may be—and preferably are—expunged from the entire mold system at the parting line where the top mold lip and the bottom mold lip abut against each other or abut against the top layer and the bottom layer. In effect, the incoming liquid or semi-liquid thermoset polymeric material completely fills the void space, immerses any primer adhesives, electronic component(s), anchor hooks, etc. contained therein and force any air present in the void space between the top and bottom layers (as well as any gases created by the chemical reaction of the starting ingredients of the polymeric material) out of the void space—and, in some preferred cases, completely out of the mold system. All such actions serve to eliminate any surface imperfections such as surface "pock marks" and/or encapsulated bubbles that might otherwise form if such gases were entrapped in the thermoset polymeric material when it solidifies to form the core region of applicant's cards.

Finally it also should be noted that the top and/or bottom layers used in applicant's processes may be at least partially molded into cavity-containing forms before they are placed in the mold system used to make the smart cards of this patent disclosure. Hence, the "cold, low pressure" molding operations called for in this patent disclosure may be only a part of the total molding to which these layer or sheet materials are subjected. Thus, for example the cold, low pressure molding procedures of this patent disclosure may provide only a partial amount of the total molding experienced by a molded top layer of applicant's smart card. In the more preferred embodiments of this invention, however, the top layer will experience a major portion, e.g., at least 50 percent, and more preferably all of the total molding it experiences (as defined by the change in the volume of the cavity created by the molding operation) by the cold, low pressure molding operations that are preferred for the hereindescribed molding operations.

BRIEF DESCRIPTION OF THE DRAWINGS

In FIG. 6, the smart card components are shown before a liquid polymeric material is injected between the card's top and bottom layers. FIG. 7 shows the mold tool set up after the polymeric material is injected into the void space between the top and bottom layers.

DETAILED DESCRIPTION OF THE INVENTION

Figure 1:
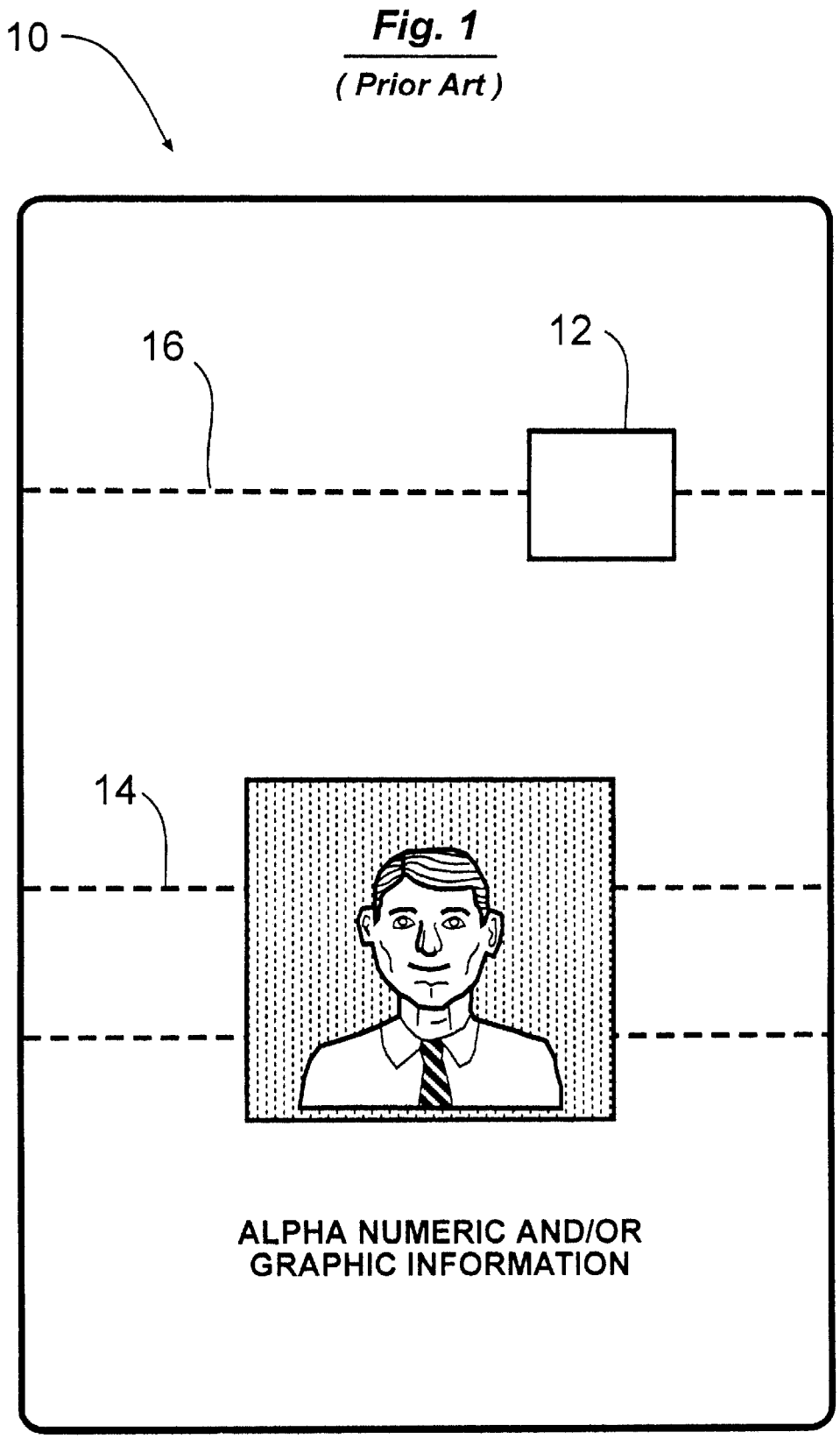
FIG. 1 is a front view of a prior art contact type smart card. It is shown having an electrical contact reader or other electrical signal pickup component, alphanumeric/graphic information and an identification photo. It also shows a phantom bend line running through the module component.

FIG. 1 depicts a prior art contact type smart card 10 displaying an identification photo, along with alphanumeric and/or graphic information. The card 10 is provided with an electrical signal sensing device 12 for communicating with a smart card-using machine such as an ATM, identification verification machine, telephone card receiving device, etc. The card also may be provided with other electronic signal sensing devices such as a magnetic strip 14. A bend line 16 is shown passing through the card at the electrical signal sensing device 12.

Figure 2:
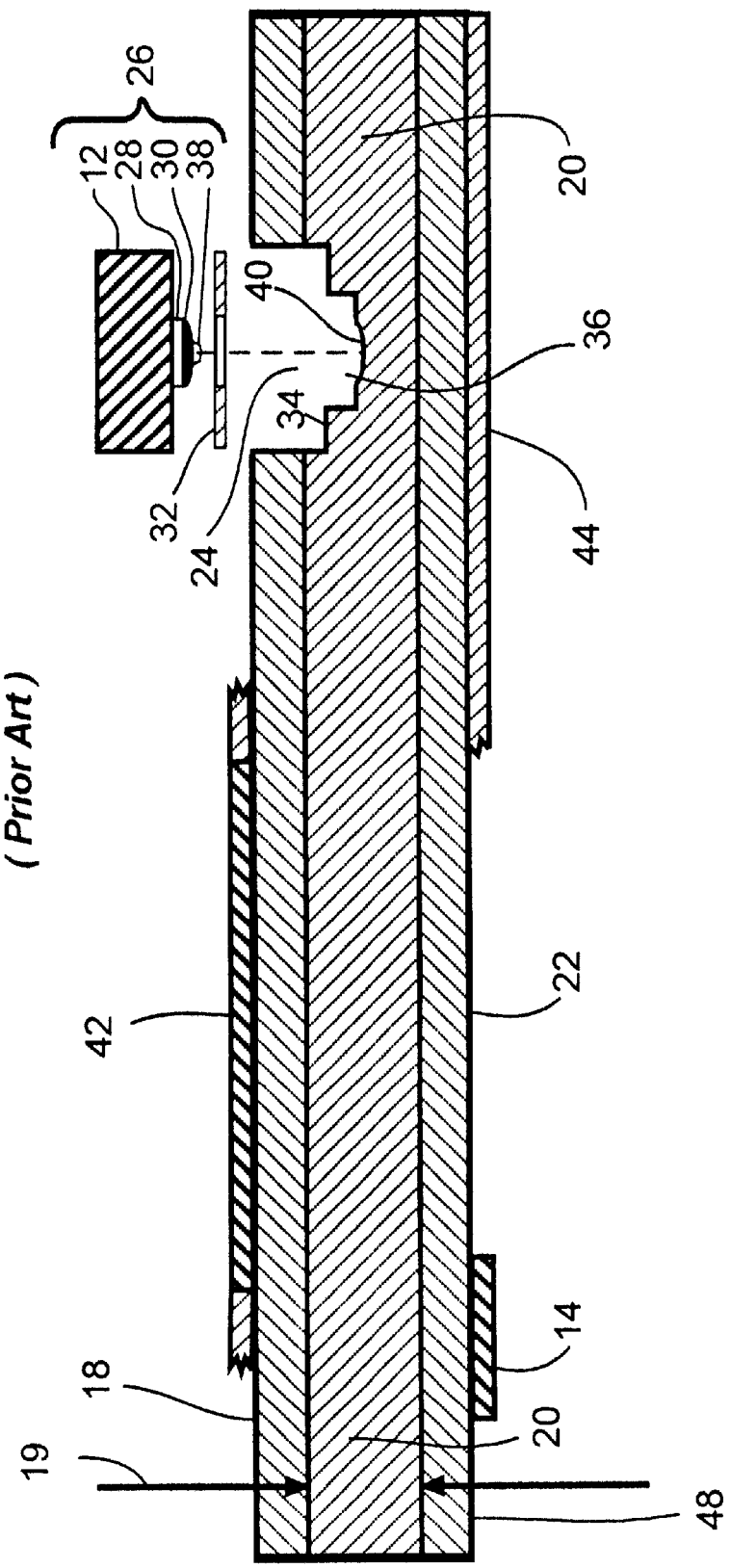
FIG. 2 is an exploded cross-sectional view of the prior art contact type smart card shown in FIG. 1.

FIG. 2 is an exploded, side view of the prior art contact smart card shown in FIG. 1. It has a top layer 18, a center or core layer 20, and a bottom layer 22. The core layer results from injecting a thermosetting material into a void space 19 between the top layer 18 and the bottom layer 22. This electrical signal sensing device 12 is shown exploded out of a cavity 24 in the top layer 18 and core layer 20 where the electrical signal sensing device 12 normally is affixed, e.g., by gluing. This electrical signal sensing device 12 is depicted as being part of a module 26 comprised of the sensing device 12, a board 28, and a chip 30. In many prior art smart cards of this kind, the electrical signal sensing device 12 or module with which it is associated (e.g., module 26) is glued to a mounting ring 32 which is, in turn, glued to a mounting ledge 34 in the cavity 24. This practice tends to produce a void space region 36 in the assembled card system.

In the module 26 depicted in FIG. 2, a computer chip 30 that stores and processes potentially valuable and/or sensitive information is shown attached to the underside of the board 28. This computer chip 30 may end in an electrical contact device 38 which is sometimes referred to as a "pod". Such a contact device 38 is adapted and arranged to make electrical contact with a pod receptacle 40. This pod receptacle 40, may, or may not, connect with other electrical components embedded in the core layer 20 of the smart card 10. Again, top layer 18 and/or the bottom layer 22 of such cards are sometimes provided with a top protective layer or coating 42 and/or a bottom protective layer 44. Such protective layers will generally cover the entire face of the card except where electrical contact components (e.g., module 26, magnetic strip 14, etc.) are shown.

Figure 3:
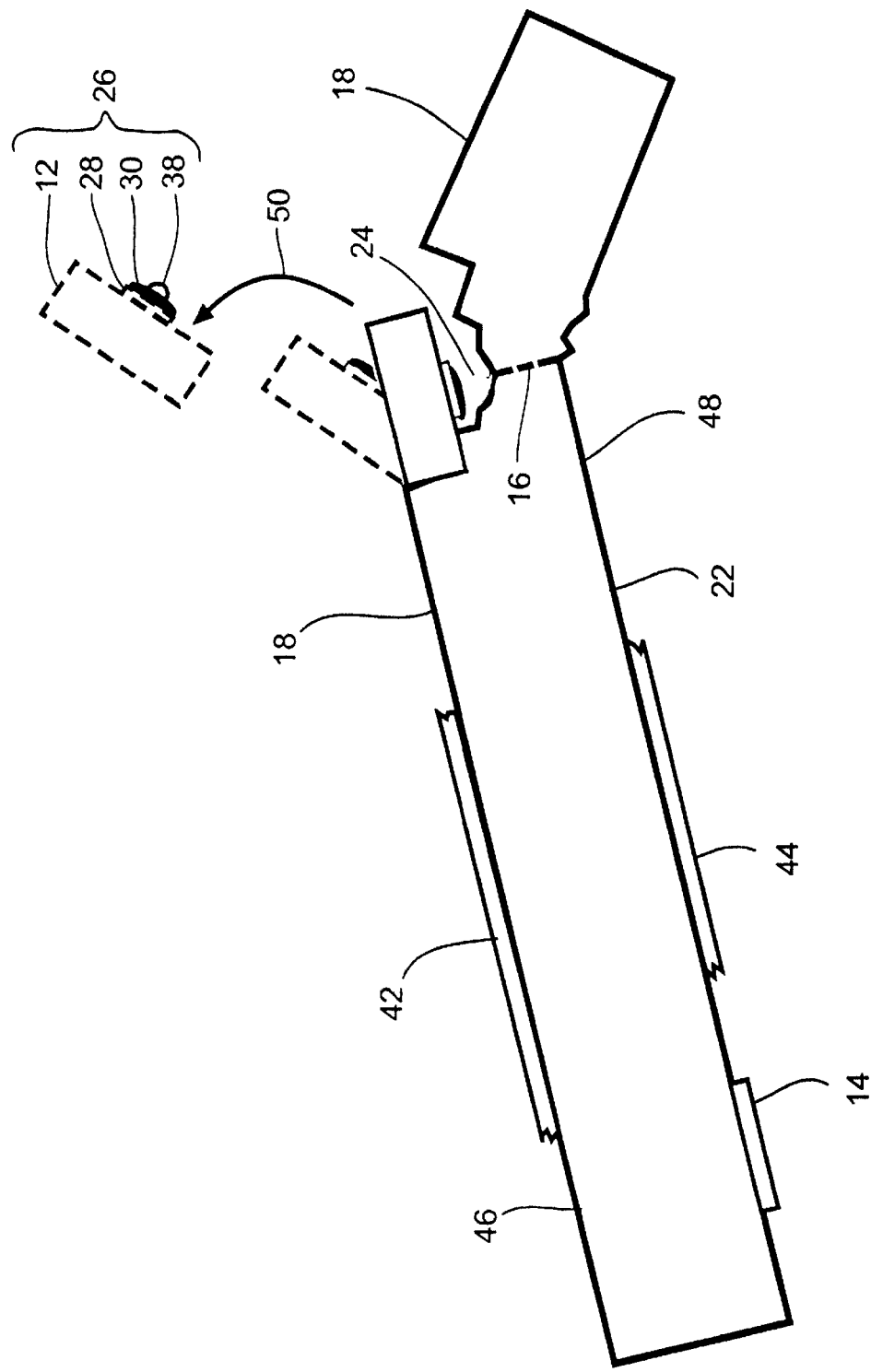
FIG. 3 shows 1 in cross section, the prior art contact type smart card of FIG. 1 in a partially bent condition.

FIG. 3 shows the prior art smart card 10 of FIG. 1 in a bent condition. The bend line 16 passes through the cavity 24 in the top layer 18 for receiving and holding a sensor/board/chip/pod module 26. It might be noted here that one of the most commonly used techniques employed by thieves and/or fraudulent users of smart cards is to first gain access to the sensor/chip/pod assembly 26 of a "valid" card by bending said card 10 in the manner generally depicted in FIG. 3. The module 26 is thereby exposed to such an extent that it can be pried and rotated in the manner generally suggested by direction arrow 50 in FIG. 3. Once the sensor/board/chip/pod module 26 is so obtained, it is then transferred to another smart card having deceptive information such a fraudulent user's identification (ID) photo.

Figure 4:
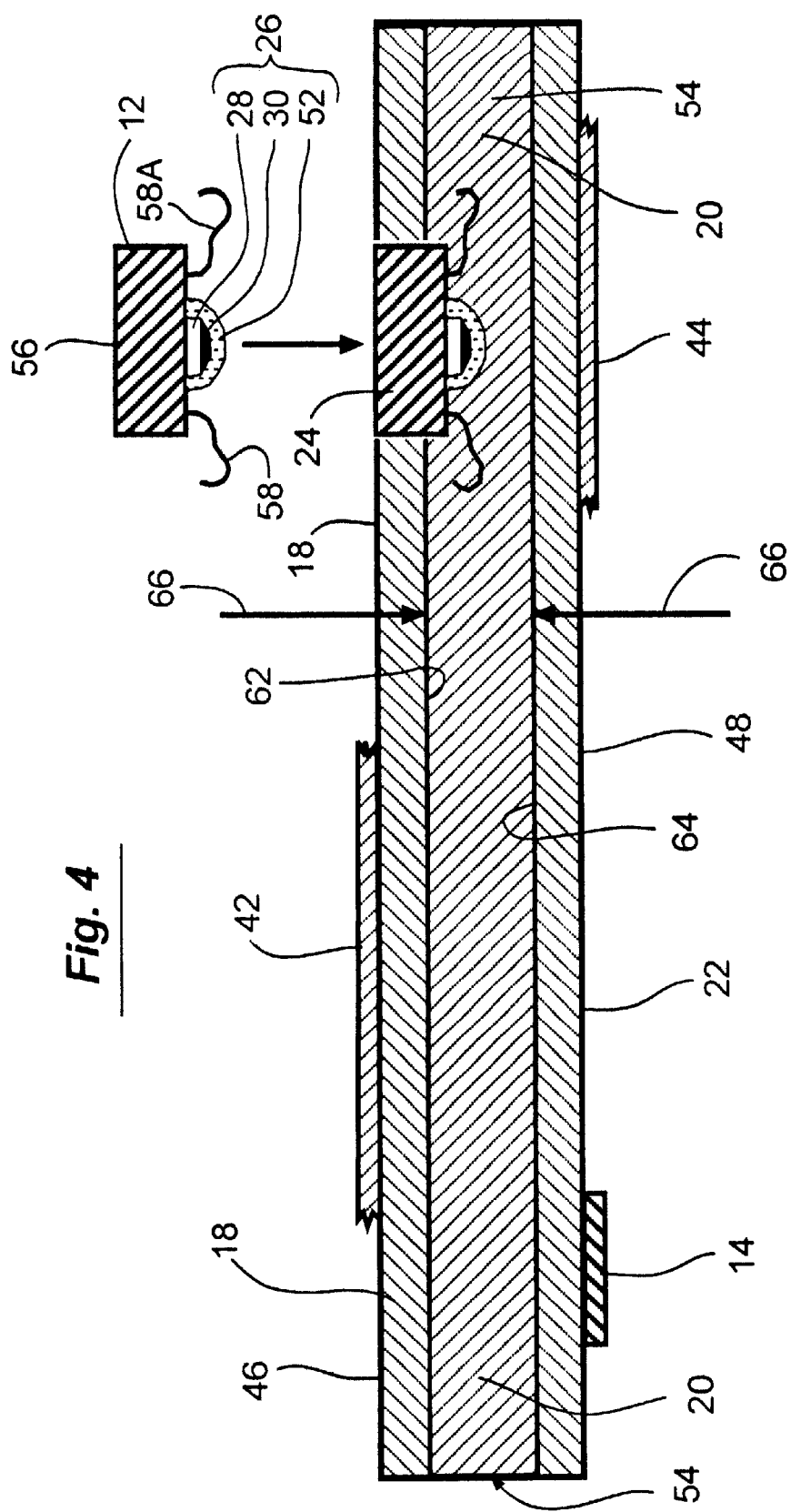
FIG. 4 shows a cross-sectional view of a contact smart card made according to the teachings of this patent disclosure.

FIG. 4 illustrates how applicant's contact type smart card is similar in many ways to those employed in the prior art in that it too has an electronic signal sensing device 12 or a sensor/board/computer chip module 26 that resides in an opening or cavity 24 in the top layer 18 (or in the bottom layer 22). In FIG. 4, all of the electrical components are depicted as part of a module 26 that is shown residing in a cavity 24 in the top layer 18 of the card 10. FIG. 4 also depicts how applicant's smart cards differ from the prior art smart cards shown in FIGS. 2 and 3. As can be seen in FIG. 4, a first major difference between applicant's smart card and those of the prior art is the fact that the underside of applicant's sensor 12 or sensor/board/chip module 26 is provided with a layer or coating of a primer/adhesive material 52. This layer or coating of primer/adhesive material 52 will be placed on an element (be it the electronic sensor 12, chip 30, etc.) or elements that come into direct physical with a thermosetting polymeric material 54 injected into the core region 20 of the smart card 10. This requirement follows from the fact that applicant has found that the bonding action between a primer/adhesive material 52 and the thermosetting polymer 54 is much stronger than the bonding action between a metallic and/or semiconductor material component (such as the sensor 12 or a sensor board/chip/pod module 26) and the thermosetting polymer 54. Indeed, applicant has found that the bonding action of a primer/adhesive 52 with the thermosetting material 54 is so strong that it very effectively resists tampering actions such as those depicted in FIG. 3. That is to say that this primer/adhesive-thermosetting polymer bond is so strong that any attempts to remove applicant's sensor or sensor board/chip/pod module 26 by physical bending a smart card in the manner shown in FIG. 3 will normally result in a severe bending of the sensor and/or the chip and module themselves. Such severe bending, and the physical damage to these elements that result from such bending will serve to debilitate the electrical processing ability of such electronic components—and thereby preventing these electronic components from being "successfully" transferred to a fraudulent smart card.

The more preferred primer/adhesive materials 52 for the practice of this invention will be of the "solvent based," thin viscosity, variety. Methyl ethyl ketone is frequently used as a solvent for such compositions. By way of example only, Minnesota Mining and Manufacturing's base primer product 4475® can be used for this bonding purpose. Thus, in its finished form, applicant's smart card 10 will be comprised of a top layer 18, a bottom layer 22, and a center or core layer 20 in which at least some of applicant's primer/adhesive material (which is attached to at least one electrical component) is in contact in a thermosetting polymeric material 54. That is to say such components (e.g., the bottom of module 26) are immersed in an initially liquid or semi-liquid thermosetting material 54, that, upon curing, constitutes a solid center or core layer 20 of a finished smart card 10. The placement of the sensor 12 (or module 26) should be such that the top surface 56 of the sensor is substantially flush or level with the top surface 46 of the card or the top surface of the protective layer 42 if such a protective layer is used.

This injected polymeric material 54 is, preferably, capable of being injected under certain relatively cold, low pressure forming conditions that are preferred for carrying out applicant's manufacturing processes. That is to say that the injection of relatively hot thermosetting materials is less preferred for the practice of this invention. In any case, an appropriate thermosetting polymeric material 54 will be injected into, and fill, a void space whose thickness 66 is defined between the inside surface 62 of the top layer 18 and the inside surface 64 of the bottom layer 22. Upon curing, the injected thermosetting polymeric material 54 of the resulting center layer 20 will bond chemically with, or otherwise adhere to, both the inside surface 62 of the top layer 18 and the inside surface 64 of the bottom layer 22 and thereby produce a unified card body. Such adherence can be aided by treating the respective inside surfaces 62 and 64 of the top and bottom layer in any one of several ways. For example, bonding agents known to this art may be employed to enhance bonding between the core layer-forming thermoset material 54 and the material(s) from which the top and bottom layers 18 and 22 are made (e.g., PVC). Here again, Minnesota Mining and Manufacturing's base primer product 4475® can be used for this bond enhancing purpose as well, especially when the top or bottom layer is made from a polyvinyl chloride material. Other treatments that can be applied to the inside surfaces of the top and/or bottom layers 18 and 22 may include, but not be limited to, plasma corona treatments and acid etching. This thermosetting polymeric material also forms a particularly strong bond with the layer of primer/adhesive 52 on any anchor hooks 58, 58A, etc. that may be employed.

Applicant also has found that another tamper-preventing action can, in its own right, be supplied to such sensing devices 12 or modules 26 by use of anchors or hooks 58, 58A, etc. which are an integral part of, or firmly attached to, at least one of the elements of the electronic sensing device or module (e.g., the electronic signal sensor 12, the board 28, the computer chip 30, etc.). These anchors or hooks 58, 58A, etc. will become embedded in the cured form of the thermosetting polymer material 54. Use of at least one such hook is required. Use of 2 or more such hooks 58 and 58A is preferred. Thus the anchor hooks can provide an anti-tampering action which is such that no layer of primer/adhesive is required. Applicant has, however, found that the combined holding action supplied by the simultaneous use of the primer/adhesive-thermosetting material bonding and the anchors or hooks 58 and 58A, etc., are such that they even better thwart fraudulent tampering with smart cards by the "bend the card and remove the module" method suggested in FIG. 3. However, each of these tamper-preventing methods can serve—in its own right—to prevent fraudulent transfer of a smart card's electrical components.

Figure 5:
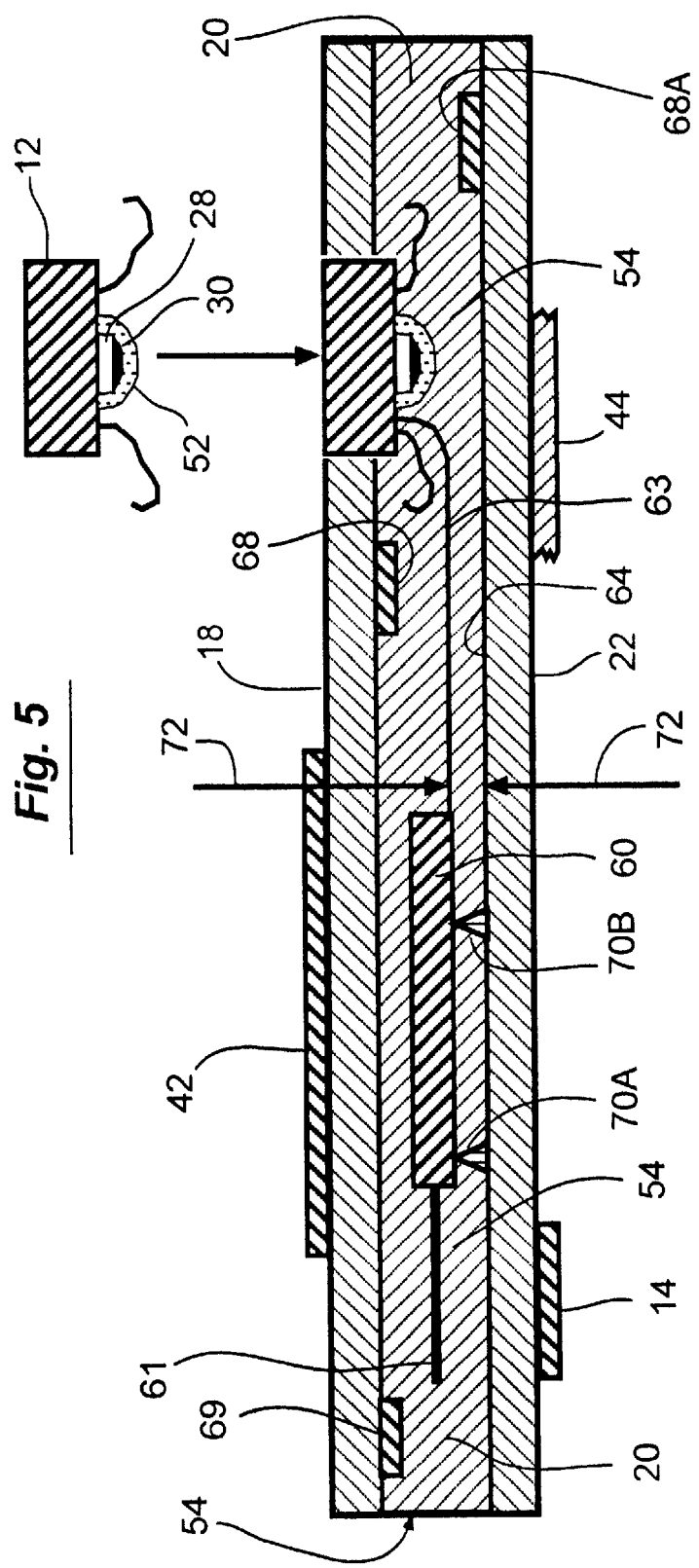
FIG. 5 show a cross-sectional view of a second embodiment of this invention wherein some of the smart card's electrical components are embedded in the card's core layer.

FIG. 5 illustrates an embodiment of this invention wherein other electronic components such as an additional chip 60, an antenna 61 and a lead line 63 are employed in conjunction with the electrical components that comprise the module 26. FIG. 5 also illustrates how the inside surface of the top and/or bottom layers 18 and/or 22 also may be further provided with one or more strips of film 68, 68A bearing alphanumeric and/or graphic information and designs. Thus, if the top layer 18 were made of a translucent polymeric material such as PVC, the alphanumeric/graphic information on such a film 68, 68A, etc. would be visible to the card user. The inside surfaces 62 and 64 of the top and bottom layers 18 and 22 also may be provided with layers of other materials such a coating 69 whose function is to decrease the opacity of the card body so that its electronic components are not visible through the card body.

Next, it should be noted that, if they are used, such other electronic component(s) (e.g., a computer chip 60, an antenna 61, etc. that is used in a hybrid, contact/contactless, smart card, etc.) are preferably positioned above the inside surface 64 of the bottom layer 22. This can be accomplished through use of one or more mounds, drops or dollops of glue, and especially a low shrinkage glue. Such electronic component(s) (e.g., a computer chip 60, an antenna 61, etc.) are most preferably placed on top of two mound(s) of glue 70A and 70B, etc. in the manner generally suggested in FIG. 5. When such mounds (70A, 70B, etc.) of glue are used, the incoming liquid or semi-liquid polymeric material 54 will flow under such electronic components 60, 61, etc. as well as over them. In other words, in the more preferred embodiments of this invention the mound(s) of glue 70A, 70B, etc. will serve as one or more "pedestal(s)" upon which the additional electronic components (e.g., a chip 60, an antenna 61, etc.) are placed so that the underside of such electronic components do not come into direct contact with the inside surface 64 of the bottom layer 22, but rather be totally immersed in the incoming thermoplastic material 54 from above, below and from the sides. This circumstance enables these electronic components to better resist any flexure and/or torsion forces the smart card may encounter upon either or both of its major outside surfaces (indeed, on any of its four outside edge surfaces). In some of the more preferred embodiments of this invention these immersed electronic components 60, 61, etc. will be positioned by the mounds of glue 70A, 70B, etc. at a distance 72 of from about 0.075 mm to about 0.13 mm above the inside surface 64 of the bottom layer 22.

Figure 6:
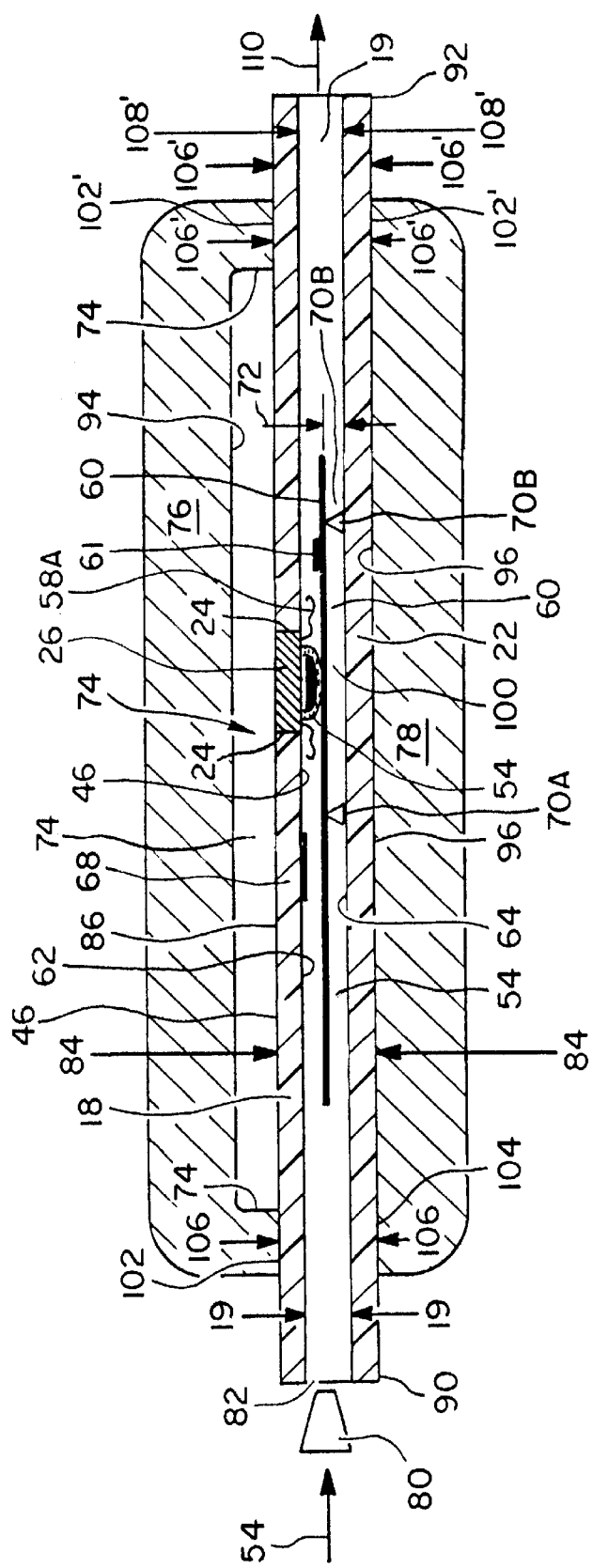
FIGS. 6 and 7 are cut-away side views of a mold tool set up for making a first preferred embodiment of a smart card of this patent disclosure.

FIG. 6 serves to illustrate (especially by contrasting FIG. 6 with FIG. 7) a first preferred embodiment of applicant's methods for making the smart cards of this patent disclosure. To this end, FIG. 6 depicts a particularly preferred embodiment of this invention wherein a flat, top layer or sheet of plastic material 18 such as PVC is shown before it is molded according to the teachings of this patent disclosure. In other words, FIG. 6 depicts the mold tool set-up just prior to injection of a thermosetting polymeric material 54. Thus, FIG. 6 shows a flat, top layer 18 (e.g., a flat sheet of PVC) as it is initially placed under a card-forming cavity 74 of a top mold 76. The top layer 18 is provided with an opening, cavity, receptacle, etc. 24 that holds a signal sensing module 26 in place during the molding operation. A bottom layer 22 (e.g., another flat sheet of PVC) also is shown as it is placed over a bottom mold 78. In some less preferred, but still viable, embodiments of applicant's processes the top layer 18 may be pre-molded or at least partially pre-molded, preferably, to the general contour of the card-forming cavity 74 in the top mold 76. By way of comparison, the bottom mold 78 has no cavity comparable to the cavity 74 in the top mold 76.

Figure 7:
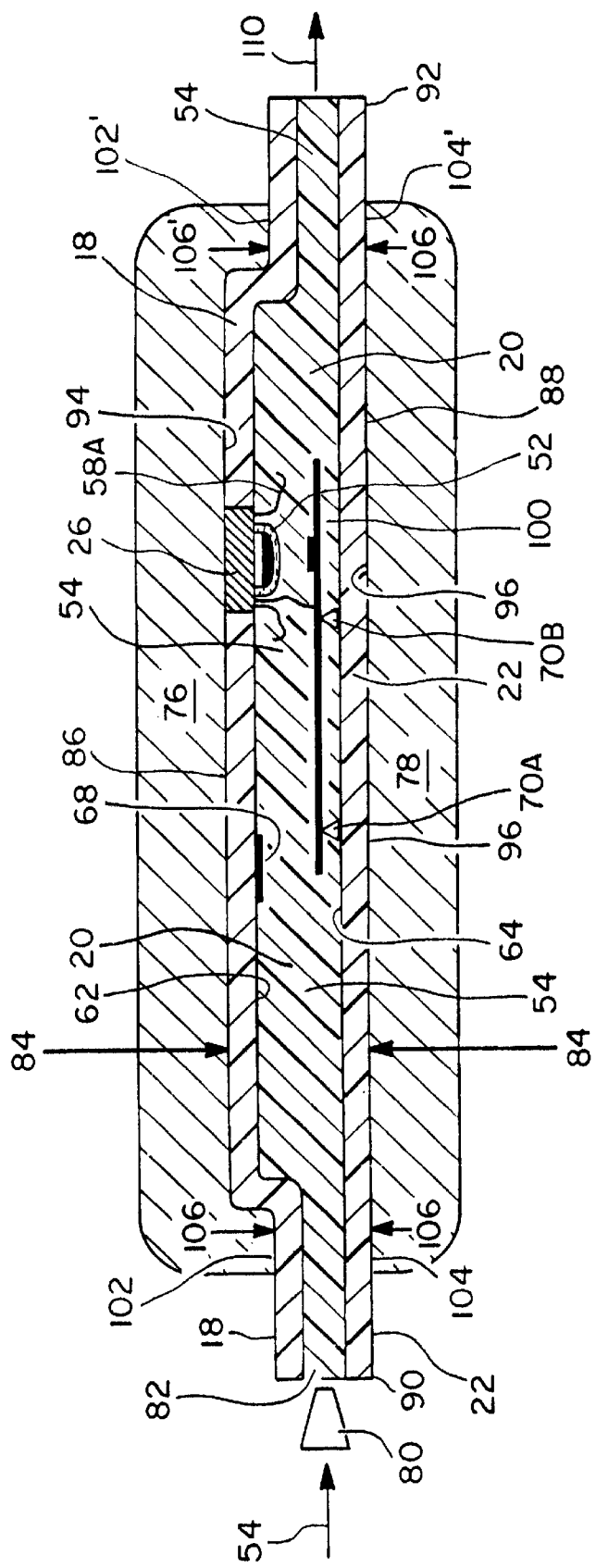

By way of further illustration, FIG. 7 depicts the molding effects of injecting a thermoset polymeric material 54 into a void space between the top and bottom layers 18 and 22.

Thus, FIG. 7 shows the top layer 18 after it has been molded into a card-forming cavity 74 in the top mold 76. A nozzle 80 for injecting a liquid or semi-liquid, thermoplastic or thermosetting polymeric material 54 is shown being inserted into an orifice 82 that leads to the void space 19 shown between the inside surface 62 of the top layer 18 and the inside surface 64 of the bottom layer 22 in FIG. 6. The distance 84 between the top surface 86 of the top layer 18 and the bottom surface 88 of the bottom layer 22 under the molding conditions will ultimately define the thickness of the finished product card 10. The void space 19 is shown extending from the left end 90 to the right end 92 of the juxtaposed top layer 18 and bottom layer 22. In FIG. 6, the top surface 86 of the top layer 18 is not yet in contact with the inside surface 94 of the card-forming cavity 74 of the top mold 76. By way of contrast, the bottom surface 88 of the bottom layer 22 is shown in substantially flat, abutting contact with the inside surface 96 of the bottom mold 78.

Again, in both FIGS. 6 and 7 electrical components 60 and 61 that may be used in addition to those electrical components that comprise the module 26 are shown positioned above the inside surface 64 of the bottom layer 22. By way of example only, such electrical components are shown pedestaled on two mounds, dabs or dollops 70A and 70B of applicant's, preferred, low shrinkage type glue. These glue pedestals serve to hold the electronic components far enough above the inside surface 64 of the bottom layer 22 (e.g., from about 0.075 mm to about 0.13 mm above said inside surface 64) so that the incoming thermosetting polymeric material 54 can invade the region 100 under the additional electrical components 60 and 61 as well as the regions above these electronic components. Again, the use of such glue pedestal arrangements are preferred because the presence of the thermoset polymeric material 54 under such electronic components tends to augment the protection of such electronic components against any forces or shocks that may be received by the outside surfaces (i.e., the outside of the bottom layer and/or the outside of the top surface) of the card.

In FIG. 6, the top mold 76 is shown having a cavity 74 which partially defines the surface contour of the top of the smart card to be formed during the molding operation. To this end, the injection of the liquid or semi-liquid thermoset polymeric material 54 should be under temperature and pressure conditions such that the top layer 18 is, preferably, cold, low pressure, formed into the cavity 74 of the top mold 76. Such conditions are preferred because they serve to prevent damage to the module 26 positioned in the top layer 18. Again, by way of illustration of the results of this molding operation, FIG. 7 shows how the thermoset injection process of this patent disclosure has, in fact, conformed the top surface 86 of the top layer 18 to the configuration of the card-forming cavity 74 in the top mold 76. Again, the bottom surface 88 of the bottom layer 22 is shown in FIG. 7 molded against a substantially flat inside surface 96 of the bottom mold 78. This is a particularly preferred arrangement for making the smart cards of this patent disclosure.

In FIGS. 6 and 7, a front lip region 102 of the top mold 18 and a front lip region 104 of the bottom mold 78 are shown spaced apart from each other by a distance 106 that (taking into consideration the thickness of the top and bottom layers 18 and 22), in effect, defines the distance 19 (i.e., the width or thickness of the void space) at the orifice 82 for injecting the thermosetting material 54. This distance 19 should be such that the thermosetting polymeric material 54 can penetrate the entire length of the core region 20 (e.g., from its left side 90 to its right side 92). The counterpart distance 106' on the right side 92 of this system may differ from that of its counterpart distance 106 on the left side. In any case, the distance defined between the inside surface 62 of the top layer 18 that passes through the rear lip 102' of the top mold 76 and the inside surface 64 of the bottom layer 22 that passes through the rear lip 104' of the bottom mold 78 is very small—but still finite. That is to say that this very small distance should be large enough to allow gases 110 (e.g., air, polymeric ingredient reaction product gases, etc.) in the void space 19 that originally existed between the top and bottom layers 18 and 22 and excess polymeric material to be exhausted from said void space 19, but still be small enough to hold the injection pressures used to inject the thermoset polymeric material 54.

Figure 8:
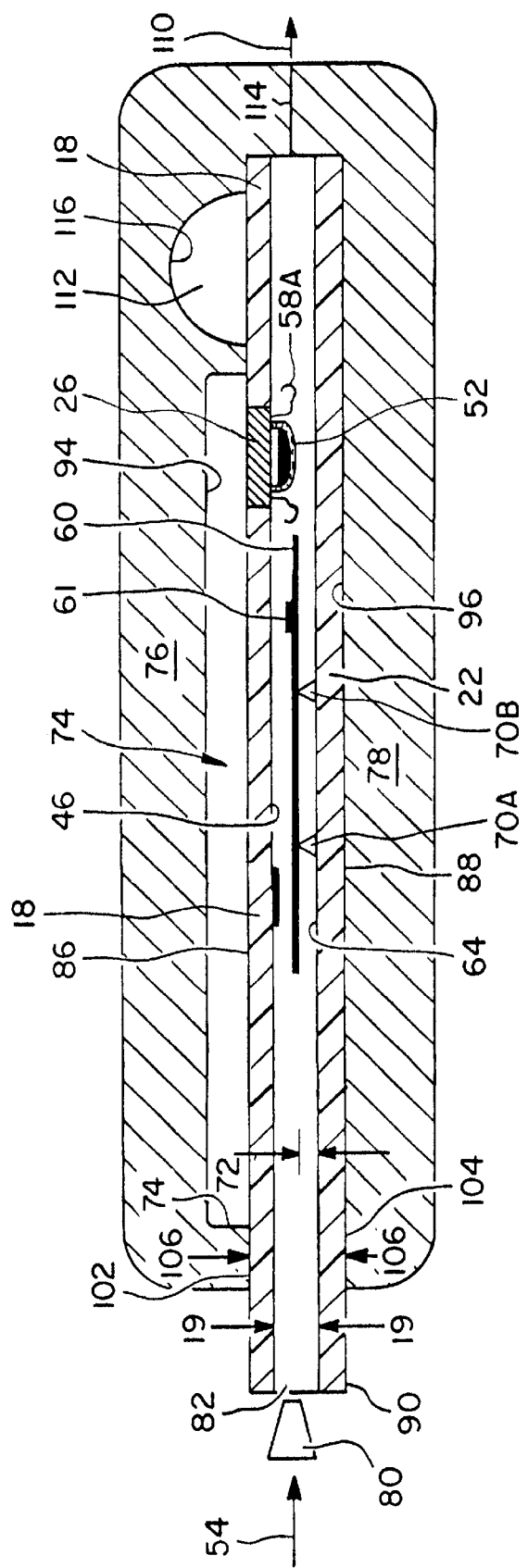
FIG. 8 depicts another preferred embodiment of this invention wherein the mold tool shown in FIG. 6 is further provided with an excess polymeric material and/or gas receiving receptacle.
Figure 9:
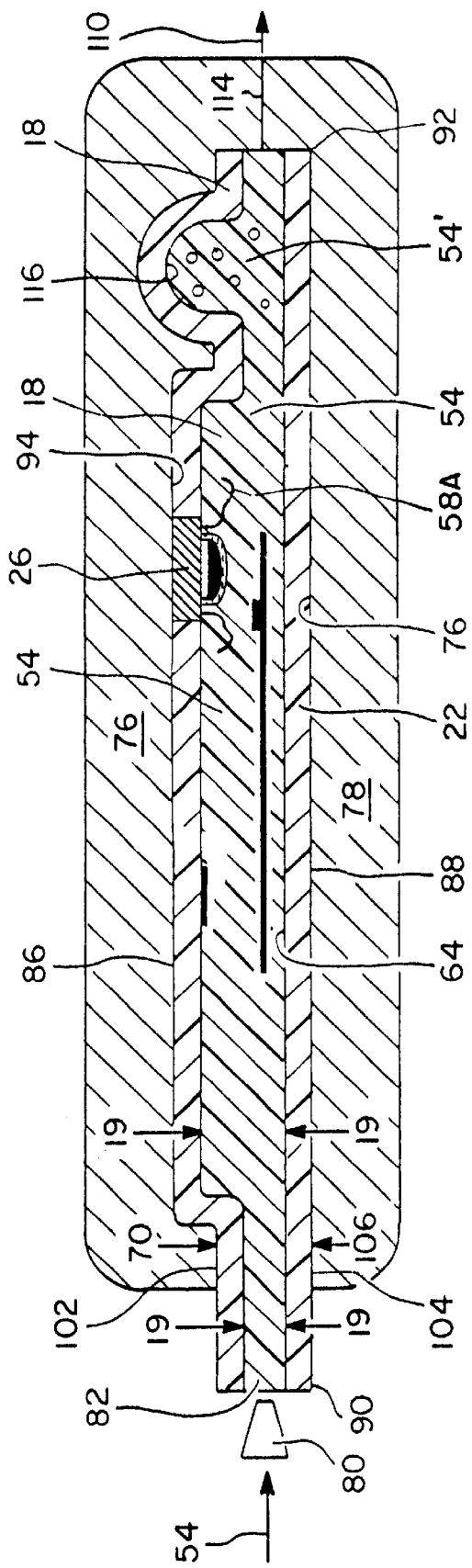
FIG. 9 depicts the result of injecting the mold system depicted in FIG. 8 with a thermosetting polymeric material.

FIGS. 8 and 9 depict an even more preferred embodiment of the process that was generally illustrated in FIGS. 6 and 7. In FIGS. 6 and 7, the rear or right side 92 of the top layer 18 and bottom layer 22 are shown protruding out of their respective molds 76 and 78. Consequently, the gases 110 (air and chemical reaction product gases) and "excess" polymeric material (i.e., polymeric material 54 in excess of that required to fill the void space 19) are expunged or exhausted out of the molds 76 and 78. This mold and exhaust arrangement may work better with some thermoset injection materials (and/or some top and bottom layer materials) than it does with others. Applicant has, however, also found that in some cases, the overall mold system depicted in FIGS. 6 and 7 is sometimes left with residual bodies of solidified excess polymeric material that, in one way or another, interfere with the manufacture of succeeding smart card(s). In effect, this arrangement sometimes leaves the overall mold device in a "dirty" condition that is not conducive to making high quality smart cards in succeeding cycles of the high speed molding operations employed to make them.

The embodiment of applicant's invention shown in FIGS. 8 and 9 can be used to correct this problem. It does this through the use of a mold shell (e.g., the top mold 76) that also is provided with an excess material receptacle cavity 112. The function of this excess material receptacle cavity 112 is to: (1) receive and hold any excess thermoset material 54 (i.e., in excess of the volume of the void space 19) and any gases (air, chemical reaction product gases) purged from the void space 19 by the injection of the polymeric thermosetting material 54 into said void space 19. Indeed, in some of the more preferred embodiments of this invention, excess polymeric material 54' will be purposely injected into the void space 19 in order to drive out any gases that might otherwise be entrapped or entrained in the center layer 20 of the card. Applicant's excess material injection procedure may entrap some of these gases in the excess polymeric material 54' in the manner generally indicated in FIG. 9 or some or all of these gases may be exhausted from the mold system at its parting line 114 as suggested by direction arrow 110. Again the "excess" thermoset material 54' is eventually trimmed from these "precursor" cards in order to create a "finished" card. It also should be noted that in this preferred embodiment of applicant's process, the top layer 18 is molded into the top regions 116 of the excess material receptacle 112 in the same general way that the top layer 18 is molded into the card forming cavity 74 of the top mold 76.

Figure 10:
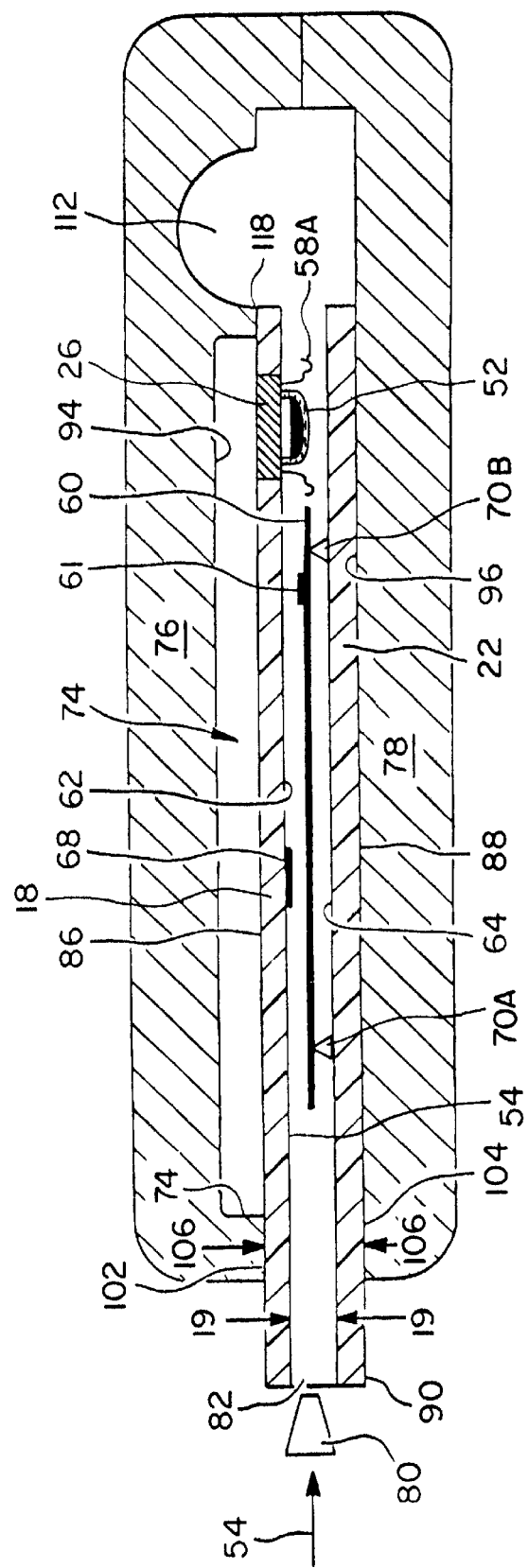
FIG. 10 illustrates another preferred embodiment of this invention wherein the top and bottom sheet or layer components of applicant's cards terminate at the front edge of a excess material receiving receptacle.

FIG. 10 depicts another preferred embodiment of this invention wherein the top layer 18 and the bottom layer 22 only extend to the front edge 118 of the excess material receptacle 112. Thus the top layer 18 is not molded into the excess material receptacle 112 as it was in the case shown in FIG. 9. In this embodiment, entrapped gases 120 and excess polymeric material 54' are not entirely ejected from the mold cavity system, as they were in the process shown in FIG. 7, but rather are "captured" and contained in the excess material receptacle 112 that itself also resides in the overall mold cavity system. Those gases 110 that are not entrapped in the excess polymeric material 54' forced into the receptacle 112 may be, and preferably are, exhausted from the mold system at its parting line 114.

Figure 11:
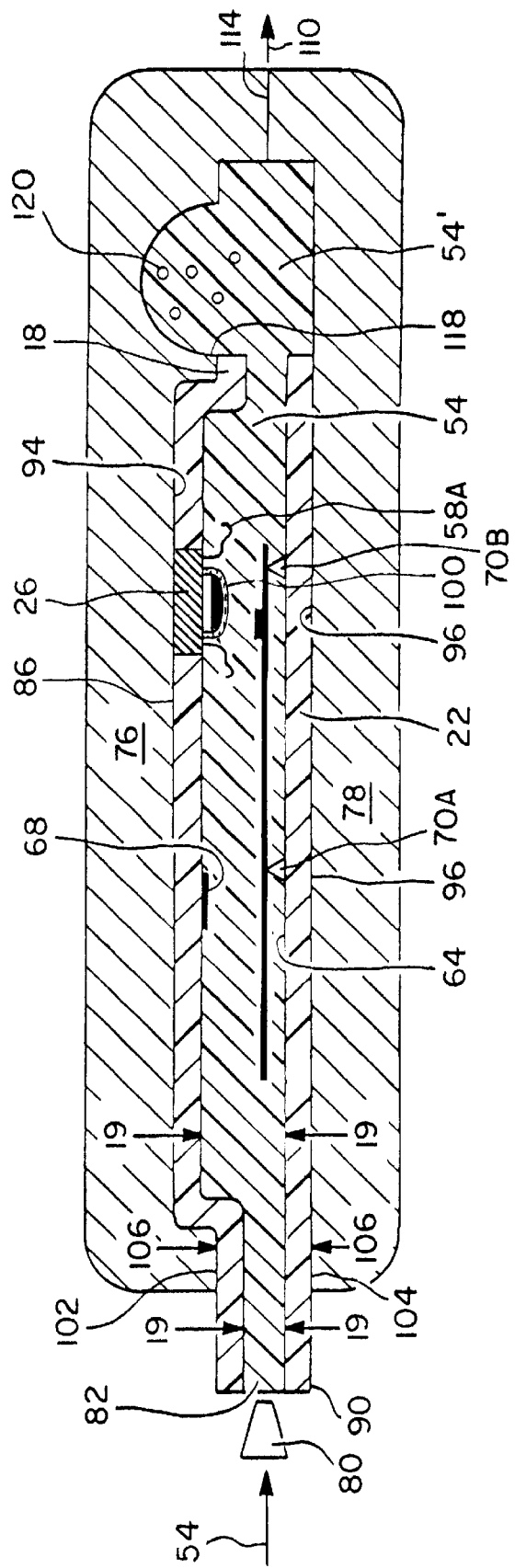
FIG. 11 depicts the system shown in FIG. 10 after the void space (and the excess material receptacle) are filled by injection of a thermosetting polymeric material.

FIG. 11 depicts the mold system shown in FIG. 10 after a thermosetting material 54 has been injected into the void space 19 between the top layer 18 and the bottom layer 22.

Figure 12:
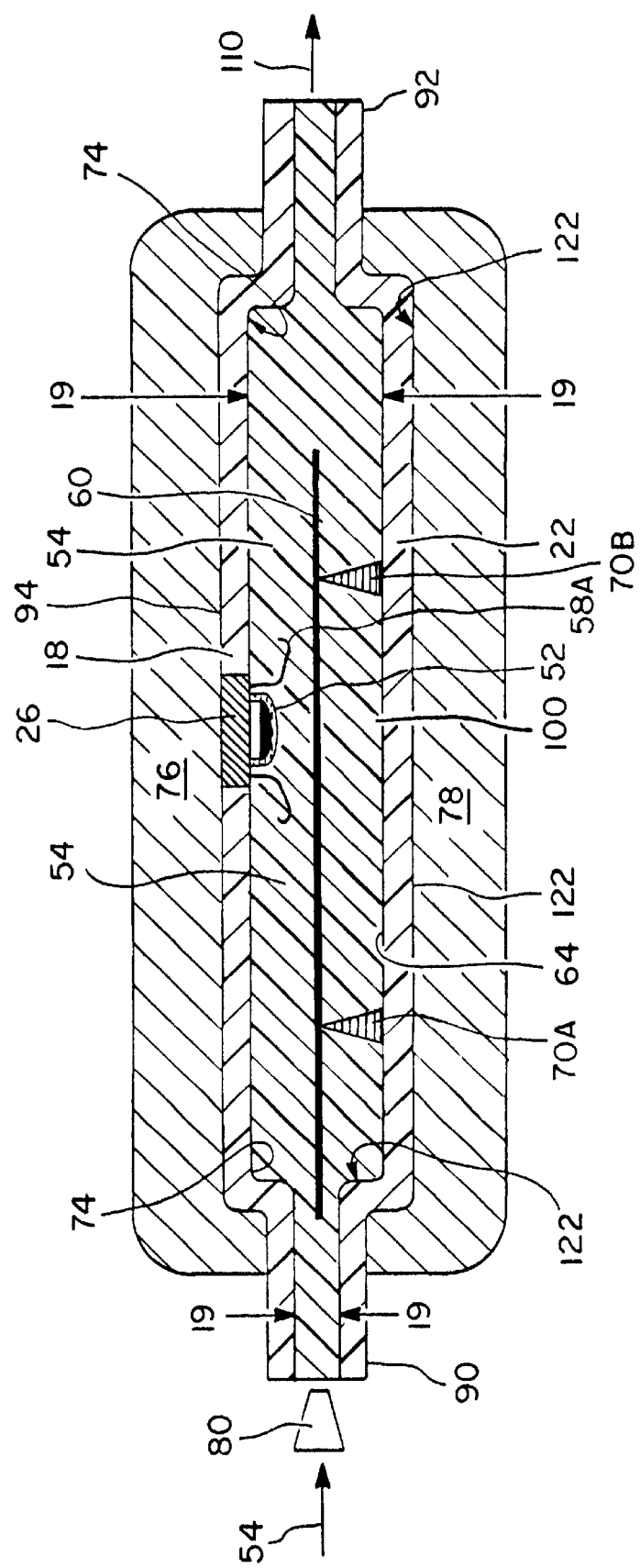
FIG. 12 is a cut-away side view of a mold tool wherein both the top layer and bottom layer are each formed in their respective mold cavities.

FIG. 12 illustrates a somewhat less preferred, but still viable, embodiment of this invention wherein the bottom mold 78 is provided with a cavity 122 much in the way that the top mold 76 is provided with a molding cavity such as the molding 74 depicted in FIG. 6.

Figure 13:
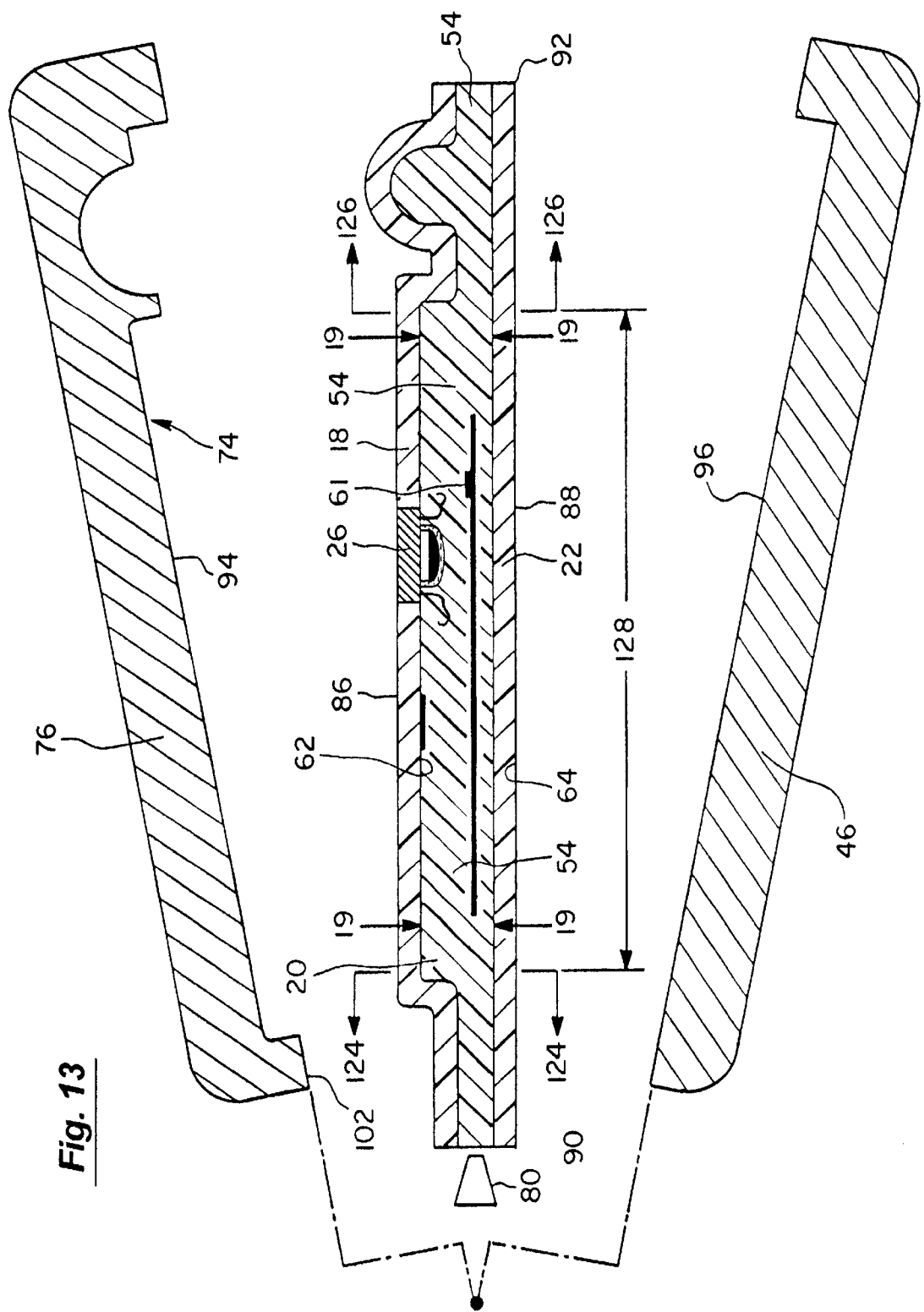
FIG. 13 is a cut-away view showing a mold tool being removed from a precursor smart card body formed by the system generally depicted in FIG. 9.

FIG. 13 shows a semi-finished or precursor smart card of the type shown in FIG. 9 being removed from a mold system. Section lines 124—124 and 126—126 respectively show how the left end 90 and right end 92 of the precursor smart card can be cut or trimmed away to create the sharp edges and precise dimensions of a finished smart card. Once more, by way of example, ISO Standard 7810 requires that such cards have a length 128 of 85 mm.

Figure 14:
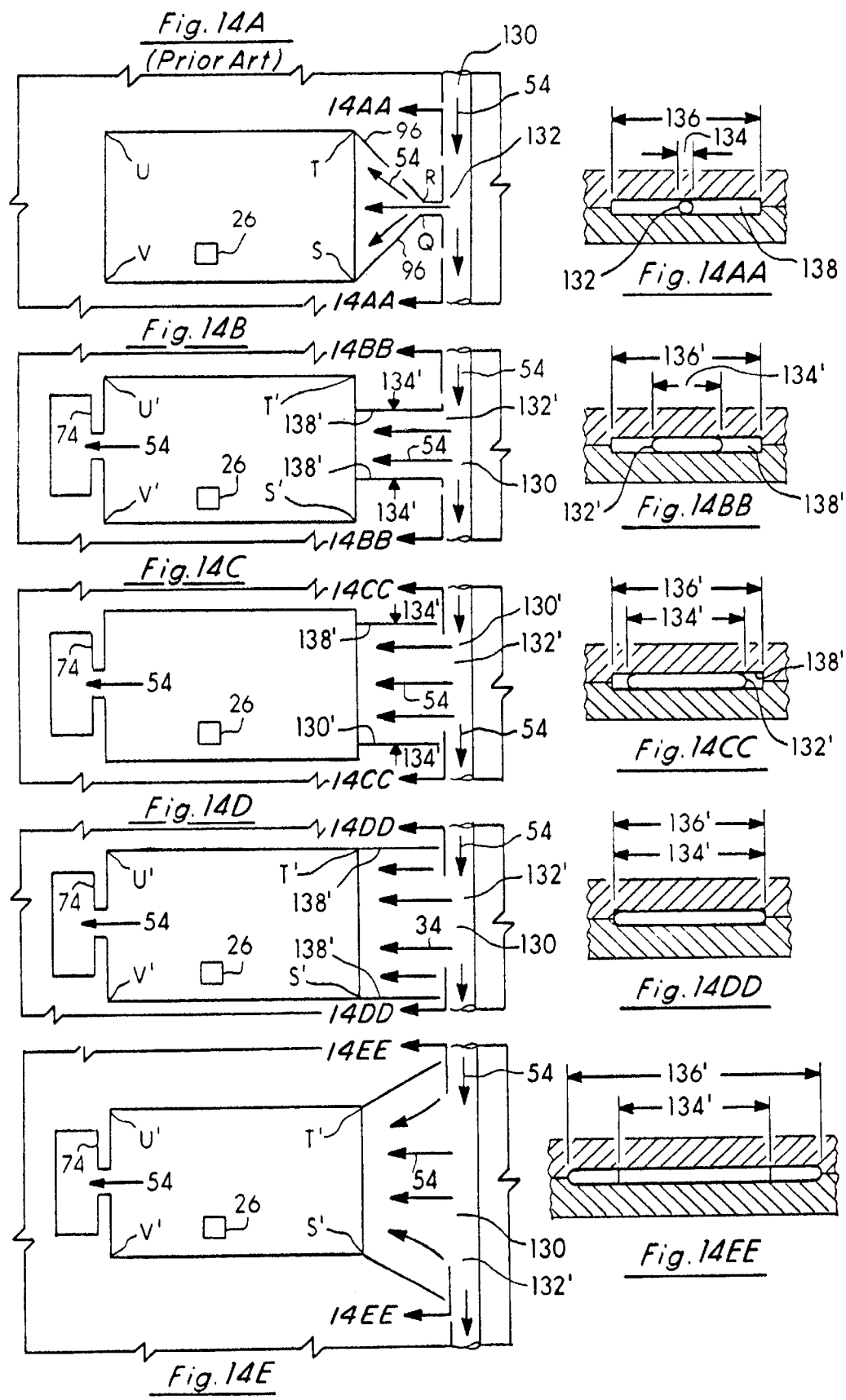
FIG. 14 depicts cut-away plan and cross section views of various comparative gates for injection of applicant's thermoset materials.

FIGS. 14(A) through 14(E) contrast various gates into which a thermoset polymeric material 54 could be injected in order to form a given smart card. For example, FIG. 14(A) depicts a prior art gate configuration Q, R, S, T commonly referred to as a fan type gate. The term "fan" refers to the fan-like, general configuration of the gate into which a thermoset polymeric material 54 is injected from a runner 130 that feeds the various gates in a manifold fashion. These fan-like gate configurations are often employed with prior art, hot, high pressure molding procedures. Be that as it may, the narrowest part of the fan Q, R, S, T in FIG. 14A is shown provided with an injection port 132 for receiving the incoming thermoset polymeric material 54. As seen in FIGS. 14(A) and 14AA, the injection port 132 has a relatively small diameter 134, relative to the width 136 (i.e., the distance from points S to point T) of the fan in the region where the gate feeds into the cavity that forms the general outline S, T, U, V of the smart card to be formed.

FIGS. 14(B) to 14(E) by way of contrast, with FIG. 14A, depict gate configurations suitable for use with the molding processes of this patent disclosure. It might also be noted here that applicant prefers to taper these gates in the manner previously described but which is not shown in FIGS. 14(B) to 14(E). In any event, the diameters of applicant's gates are significantly larger than the gates used in prior art smart card molding processes. For example the diameter 134 of the injection port 132 of prior art systems such as that depicted in FIGS. 14A and 14AA may be something on the order of 7.0 mm while the width of the fan 136 along the line extending from point S to point T (which is also the nominal width of the credit card to be formed) is about 54 mm (as per the requirements of ISO Standard 7810). Hence, as seen in the cross sectional view depicted in FIG. 14AA, the diameter of the prior art injection port 132 of FIG. 14(A) that leads from the main polymeric material supply runner 130 to the gate 138 is about 1/10 of the width 136 of the edge of the card to be formed. Such relative dimensions (a gate that is 1/10 as wide as the edge of the card being serviced by that gate) suffice in most prior art manufacturing methods wherein hot, high pressure forming conditions are being applied to a less viscous thermoplastic material. For example, some prior art processes inject their polymeric materials at temperatures ranging from in excess of 200° F.

to 1000° F. at pressures ranging from 500 to 20,000 psi. Again such high temperature and high pressure conditions differ considerably from those low temperature and pressure conditions that are preferably used in applicant's processes.

By way of contrast with such prior art runner gate systems, such as the one depicted in FIG. 14(A), applicant's gate systems, as depicted in FIGS. 14(B) to 14(E), for making smart cards that are preferably made through use of relatively cold, low pressure conditions are characterized by their relatively wide gates. Applicant has found that under the relatively cold, low pressure conditions (e.g., 56° F. to 100° F. and atmospheric pressure to 200 psi) that are preferably employed in the hereindescribed processes, higher quality precursor cards (and hence finished cards) are produced when the width or diameter 134' of an injection port 132' for a gate 138' is considerably wider than those employed in prior art manufacturing methods. To this end, FIGS. 14BB through 14EE illustrate four variations of applicant's "wide gate" concept. In FIG. 14BB, for example, the diameter 134' of injection port or gate 132' is about 50 percent of the width 136' the precursor card to be formed. In FIG. 14CC the width 134' of the injection port or gate 132' is about 80 percent of the width (the distance from point S' to point T') of the precursor card. In FIG. 14DD the width 134' of the injection port or gate 132' and the width 136' (the distance from point S' to point T') of the precursor credit card (S', T', U', V') are substantially the same. FIG. 14EE depicts a card molding system wherein the width 134' of the gate is greater (e.g., about 25% greater) than the width 136' of the edge of (depicted by the distance from point S' to point T') of the precursor smart card S', T', U', V'. In general, applicant has found that the best results are obtained when the width 134' of the gates used in these molding processes are from about 25% to about 200% of the width (the distance from point S' to point T') of the edge of the precursor card serviced by the gate. This contrasts sharply with most prior art (high temperature/high pressure) systems where the width of the injection port (again note the distance from point Q to point R in FIG. 14AA) is usually less than about 10 percent of the width (the distance from point S to point T) of the edge of the card being serviced by that gate.

Figure 15:
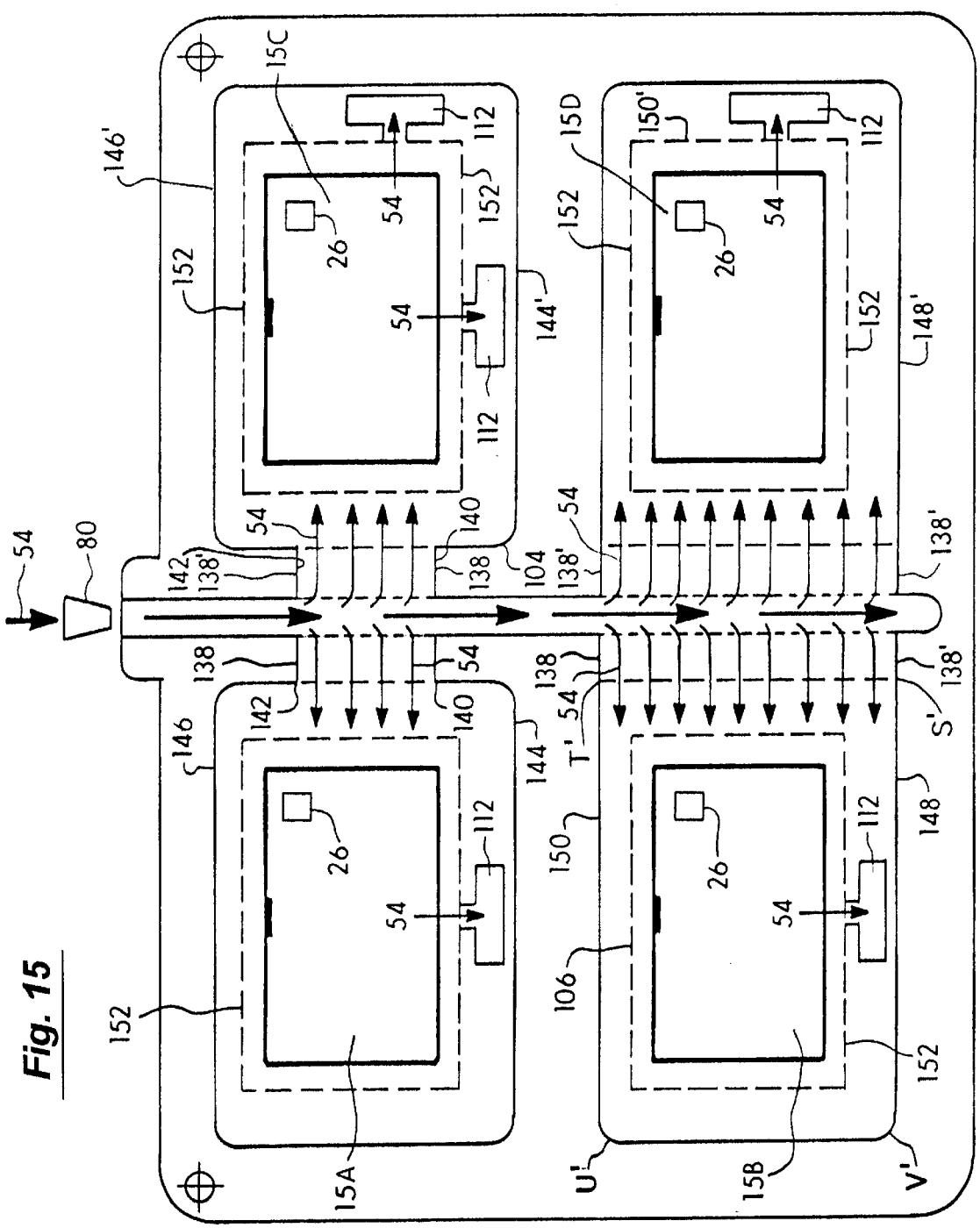
FIG. 15 depicts a mold tool system capable of making multiple (i.e., four) smart cards simultaneously according to the teachings of this patent disclosure.

FIG. 15 illustrates a molding procedure being carried out according to some of the preferred embodiments of this patent disclosure wherein four credit cards are being molded simultaneously in a system wherein, by way of example only, the closest two cavities (closest to the injection nozzle 80) are being fed with an incoming thermoset polymeric material 54 via respective gates 138 and 138' having a width (e.g., the distance from point 140 to point 142) that is about one half of the width of the precursor card (the distance from point 144 to point 146) while the two more remote (i.e., more remote from the injection nozzle 80) card-forming cavities 15B and 15D have injection ports and gates that are substantially as wide as the width (148 to 150) of the precursor card itself. The dotted line 152 shown in FIG. 15 depicts the outline of a finished smart card after the edges have been trimmed to (a given size and to eliminate the excess thermoset material in the excess material receptacles 112) to produce a finished smart card (e.g., one having a length of 85 mm and a width of 54 mm as per ISO Standard 7810). Again, these cards may be further "finished" by application of alphanumeric/graphic information on their major exterior surfaces, e.g., by various printing and/or film application procedures known to those skilled in this art.

While this invention has been described with respect to various specific examples and a spirit which is committed to the concept of the use of a layer of primer/adhesive between the electrical sensor or module of a contact type smart card, it is to be understood that the hereindescribed invention should be limited in scope only by the following claims.

Thus, what is claimed is:

1. A method for making a contact type smart card comprising a top layer in which an electrical sensing device resides, a core layer and a bottom layer, said method comprising:
   (1) coating a layer of primer and/or adhesive on the underside of the electrical sensor device such that said layer of primer/adhesive will come into direct physical contact with a thermosetting polymeric material that forms the core layers of the smart card;
   (2) positioning the electrical sensor device in an opening in the top layer;
   (3) positioning the top layer and bottom layer in a mold set up that defines a void space between the top layer and the bottom layer;
   (4) injecting a thermosetting polymeric material into the void space under conditions such that the primer/adhesive comes into direct physical contact with the thermosetting polymeric material to form a unified precursor smart card body;
   (5) removing the unified precursor smart card body from the mold set up; and
   (6) trimming the precursor smart card to a desired dimension to produce a smart card.

2. The method of claim 1 wherein the electrical sensor device is provided with at least one anchor device.

3. The method of claim 1 wherein the inside surface of the top layer and the inside surface of the bottom layer are treated to facilitate the creation of a strong bond between the top layer and the thermosetting material and the bottom layer and the thermosetting material.

4. The method of claim 1 wherein the inside surface of the top layer and the inside surface of the bottom layer are treated by coating each with a bonding agent.

5. The method of claim 1 wherein the inside surface of the top layer and the inside surface of the bottom layer are treated by a corona discharge process.

6. The method of claim 1 wherein the thermosetting material is injected into the void space at a pressure between about ambient pressure and about 500 psi.

7. The method of claim 1 wherein the thermosetting material is injected into the void space at a pressure between about 80 and about 120 psi.

8. The method of claim 1 wherein the thermosetting material is injected into the void space at a temperature between about 56° F. and about 100° F.

9. The method of claim 1 wherein the thermosetting material is injected into the void space between the top layer and the bottom layer at a temperature between about 65° F. and about 70° F.

10. The method of claim 1 wherein a film bearing alphanumeric and/or graphic information is applied to the inside surface of the top layer.

11. The method of claim 1 wherein a layer of material is applied to the inside surface of the top layer and the inside surface of the bottom layer to decrease the opacity of the card.

12. The method of claim 1 wherein the top layer and the bottom layer are each formed from a flat sheet of polymeric material.

13. The method of claim 1 wherein the top layer is preformed with at least one card-forming cavity.

14. The method of claim 1 wherein the top layer is molded into a card-forming cavity of a top mold and the bottom layer is molded against a substantially flat surface of a bottom mold.

15. The method of claim 1 wherein the thermosetting material is a polyurethane.

16. The method of claim 1 wherein the thermosetting material is an epoxy.

17. The method of claim 1 wherein the thermosetting material is an unsaturated polyester.

18. The method of claim 1 wherein the void space is filled by a gate whose width is at least about 25 percent of the width of an edge of a precursor card being serviced by said gate.

19. The method of claim 1 wherein the card is provided with a magnetic strip.

20. A method for making a contact type smart card comprising a top layer in which an electrical sensor device resides, a core layer and a bottom layer, said method comprising:
   (1) coating a layer of primer and/or adhesive on underside of the electrical sensor device such that said layer of primer/adhesive will come into direct physical contact with a thermosetting polymeric material that forms the core layer of the smart card;
   (2) positioning the electrical sensor device in an opening in top layer;
   (3) positioning the top layer and bottom layer in a mold set up that defines a void space between the top layer and the bottom layer;
   (4) injecting a thermosetting polymeric material into the void space under conditions which are such that: (a) the primer/adhesive comes into direct physical contact with the thermosetting polymeric material, (b) at least one layer of the smart card is at least partially cold, low pressure molded into a cavity in the top mold, (c) gases and excess polymeric material are driven out of the void space, (d) the electronic component is encapsulated in the thermosetting polymeric material before the partially cured glue becomes completely cured and (e) the thermosetting polymeric material bonds with both the top layer and the bottom layer to produce a unified precursor smart card body;
   (5) removing the unified precursor smart card body from the mold device; and
   (6) trimming the precursor smart card to a desired dimension to produce a smart card.

21. The method of claim 20 wherein the electrical sensor device is provided with at least one anchor device.

22. The method of claim 20 wherein the inside surface of the top layer and the inside surface of the bottom layer are treated to facilitate the creation of a strong bond between the top layer and the thermosetting material and the bottom layer and the thermosetting material.

23. The method of claim 20 wherein the inside surface of the top layer and the inside surface of the bottom layer are treated by coating each with a bonding agent.

24. The method of claim 20 wherein the inside surface of the top layer and the inside surface of the bottom layer are treated by a corona discharge process.

25. The method of claim 20 wherein the thermosetting material is injected into the void space at a pressure between about ambient pressure and about 500 psi.

26. The method of claim 20 wherein the thermosetting material is injected into the void space at a pressure between about 80 and about 120 psi.

27. The method of claim 20 wherein the thermosetting material is injected into the void space at a temperature between about 56° F. and about 100° F.

28. The method of claim 20 wherein the thermosetting material is injected into the void space between the top layer and the bottom layer at a temperature between about 65° F. and about 70° F.

29. The method of claim 20 wherein a film bearing a alphanumeric/graphic information is applied to the inside surface of the top layer.

30. The method of claim 20 wherein a layer of material is applied to the inside surface of the top layer and the inside surface of the bottom layer to decrease the opacity of the card.

31. The method of claim 20 wherein the top layer and the bottom layer are each formed from a flat sheet of polymeric material.

32. The method of claim 20 wherein the top layer is preformed with at least one card-forming cavity.

33. The method of claim 20 wherein the top layer is molded into a card-forming cavity of a top mold and the bottom layer is molded against a substantially flat surface of a bottom mold.

34. The method of claim 20 wherein the thermosetting material is a polyurethane.

35. The method of claim 20 wherein the thermosetting material is an epoxy.

36. The method of claim 20 wherein the thermosetting material is an unsaturated polyester.

37. The method of claim 20 wherein the void space is filled by a gate whose width is at least about 25 percent of the width of an edge of a precursor card being serviced by said gate.

38. The method of claim 37 wherein the card is provided with a magnetic strip.

39. A method for making a contact type smart card comprising a top layer in which an electrical sensing device resides, a core layer and a bottom layer, said process comprising:
   (1) providing the electrical sensor device with at least one anchor device that will come into direct physical contact with a thermosetting polymeric material that forms the core layers of the smart card;
   (2) positioning the electrical sensor device in an opening in the top layer;
   (3) positioning the top layer and bottom layer in a mold set up that defines a void space between the top layer and the bottom layer;
   (4) injecting a thermosetting polymeric material into the void space under conditions such that the anchor device comes into direct physical contact with the thermosetting polymeric material and form a unified precursor smart card body;
   (5) removing the unified precursor smart card body from the mold set up; and
   (6) trimming the precursor smart card to a desired dimension to produce a smart card.

40. The method of claim 39 wherein the electrical sensor device is provided with a layer of primer and/or adhesive that also comes in direct physical contact with the thermosetting material.

41. The method of claim 39 wherein the inside surface of the top layer and the inside surface of the bottom layer are treated to facilitate the creation of a strong bond between the top layer and the thermosetting material and the bottom layer and the thermosetting material.

42. The method of claim 39 wherein the inside surface of the top layer and the inside surface of the bottom layer are treated by coating each with a bonding agent.

43. The method of claim 39 wherein the inside surface of the top layer and the inside surface of the bottom layer are treated by a corona discharge process.

44. The method of claim 39 wherein the thermosetting material is injected into the void space at a pressure between about ambient pressure and about 500 psi.

45. The method of claim 39 wherein the thermosetting material is injected into the void space at a pressure between about 80 and about 120 psi.

46. The method of claim 39 wherein the thermosetting material is injected into the void space at a temperature between about 56° F. and about 100° F.

47. The method of claim 39 wherein the thermosetting material is injected into the void space between the top layer and the bottom layer at a temperature between about 65° F. and about 70° F.

48. The method of claim 39 wherein a film bearing alphanumeric and/or graphic information is applied to the inside surface of the top layer.

49. The method of claim 39 wherein a layer of material is applied to the inside surface of the top layer and the inside surface of the bottom layer to decrease the opacity of the card.

50. The method of claim 39 wherein the top layer and the bottom layer are each formed from a flat sheet of polymeric material.

51. The method of claim 39 wherein the top layer is preformed with at least one card-forming cavity.

52. The method of claim 39 wherein the top layer is molded into a card-forming cavity of a top mold and the bottom layer is molded against a substantially flat surface of a bottom mold.

53. The method of claim 39 wherein the thermosetting material is a polyurethane.

54. The method of claim 39 wherein the thermosetting material is an epoxy.

55. The method of claim 39 wherein the thermosetting material is an unsaturated polyester.

56. The method of claim 39 wherein the void space is filled by a gate whose width is at least about 25 percent of the width of an edge of a precursor card being serviced by said gate.

57. The method of claim 39 wherein the card is provided with a magnetic strip.

58. A method for making a contact type smart card comprising a top layer in which an electrical sensor device resides, a core layer and a bottom layer, said method comprising:

(1) providing the electrical sensor device with a least one anchor device that will come into direct physical contact with a thermosetting polymeric material that forms the core layer of the smart card;

(2) positioning the electrical sensor device in an opening in top layer;

(3) positioning the top layer and bottom layer in a mold set up that defines a void space between the top layer and the bottom layer;

(4) injecting a thermosetting polymeric material into the void space under conditions which are such that: (a) the anchor device comes into direct physical contact with the thermosetting polymeric material, (b) at least one layer of the smart card is at least partially cold, low pressure molded into a cavity in the top mold, (c) gases and excess polymeric material are driven out of the void space, (d) the electronic component is encapsulated in the thermosetting polymeric material before the partially cured glue becomes completely cured and (e) the thermosetting polymeric material bonds with both the top layer and the bottom layer to produce a unified precursor smart card body;

(5) removing the unified precursor smart card body from the mold device; and (6) trimming the precursor smart card to a desired dimension to produce a smart card.

59. The method of claim 58 wherein the electrical sensor device provided with a layer of primer and/or adhesive that also comes in direct physical contact with the thermosetting material.

60. The method of claim 58 wherein the inside surface of the top layer and the inside surface of the bottom layer are treated to facilitate the creation of a strong bond between the top layer and the thermosetting material and the bottom layer and the thermosetting material.

61. The method of claim 58 wherein the inside surface of the top layer and the inside surface of the bottom layer are treated by coating each with a bonding agent.

62. The method of claim 58 wherein the inside surface of the top layer and the inside surface of the bottom layer are treated by a corona discharge process.

63. The method of claim 58 wherein the thermosetting material is injected into the void space at a pressure between about ambient pressure and about 500 psi.

64. The method of claim 58 wherein the thermosetting material is injected into the void space at a pressure between about 80 and about 120 psi.

65. The method of claim 58 wherein the thermosetting material is injected into the void space at a temperature between about 56° F. and about 100° F.

66. The method of claim 58 wherein the thermosetting material is injected into the void space between the top layer and the bottom layer at a temperature between about 65° F. and about 70° F.

67. The method of claim 58 wherein a film bearing alphanumeric and/or graphic information is applied to the inside surface of the top layer.

68. The method of claim 58 wherein a layer of material is applied to the inside surface of the top layer and the inside surface of the bottom layer to decrease the opacity of the card.

69. The method of claim 58 wherein the top layer and the bottom layer are each formed from a flat sheet of polymeric material.

70. The method of claim 58 wherein the top layer is preformed with at least one card-forming cavity.

71. The method of claim 58 wherein the top layer is molded into a card-forming cavity of a top mold and the bottom layer is molded against a substantially flat surface of a bottom mold.

72. The method of claim 58 wherein the thermosetting material is a polyurethane.

73. The method of claim 58 wherein the thermosetting material is an epoxy.

74. The method of claim 58 wherein the thermosetting material is an unsaturated polyester.

75. The method of claim 58 wherein the void space is filled by a gate whose width is at least about 25 percent of the width of an edge of a precursor card being serviced by said gate.

76. The method of claim 58 wherein the card is provided with a magnetic strip.

* * * * *